(12) United States Patent
Yamamoto et al.

(10) Patent No.: US 12,486,371 B2
(45) Date of Patent: Dec. 2, 2025

(54) THERMALLY CURABLE RESIN COMPOSITION, CURED OBJECT, RESIN SHEET, PREPREG, METAL-CLAD LAMINATE, MULTILAYERED PRINTED WIRING BOARD, SEALING MATERIAL, FIBER-REINFORCED COMPOSITE MATERIAL, ADHESIVE, AND SEMICONDUCTOR DEVICE

(71) Applicant: NIPPON KAYAKU KABUSHIKI KAISHA, Tokyo (JP)

(72) Inventors: Kazuyoshi Yamamoto, Tokyo (JP); Takahumi Mizuguchi, Tokyo (JP); Eri Yoshizawa, Tokyo (JP); Mao Takeda, Tokyo (JP)

(73) Assignee: NIPPON KAYAKU KABUSHIKI KAISHA, Tokyo (JP)

( * ) Notice: Subject to any disclaimer, the term of this patent is extended or adjusted under 35 U.S.C. 154(b) by 292 days.

(21) Appl. No.: 18/276,056

(22) PCT Filed: Nov. 4, 2021

(86) PCT No.: PCT/JP2021/040617
§ 371 (c)(1),
(2) Date: Aug. 7, 2023

(87) PCT Pub. No.: WO2022/201619
PCT Pub. Date: Sep. 29, 2022

(65) Prior Publication Data
US 2024/0043637 A1  Feb. 8, 2024

(30) Foreign Application Priority Data

Mar. 25, 2021 (JP) .................................. 2021-052291

(51) Int. Cl.
| | |
|---|---|
| *C08J 5/24* | (2006.01) |
| *C08F 222/40* | (2006.01) |
| *C09J 179/08* | (2006.01) |
| *H01L 23/29* | (2006.01) |
| *H05K 1/03* | (2006.01) |

(52) U.S. Cl.
CPC ............. *C08J 5/246* (2021.05); *C08F 222/40* (2013.01); *C09J 179/08* (2013.01); *H01L 23/295* (2013.01); *H05K 1/0373* (2013.01); *C09J 2203/326* (2013.01); *H05K 2201/0154* (2013.01)

(58) Field of Classification Search
CPC . C08J 5/246; C08J 5/24; C08F 222/40; C08G 73/12; C08G 73/10; C08G 2479/08; C08G 2379/08; B32B 15/08; B32B 15/088; B32B 27/26; B32B 27/34; H05K 2201/0154; H05K 1/03; H05K 1/0373; H01L 23/293; H01L 23/295; H01L 23/564; C09J 2203/326; C09J 179/08; C08L 79/08; C08L 79/085; C08K 5/14; C08K 5/3445; C08K 5/53; C08K 5/5313
USPC ......................................................... 428/209
See application file for complete search history.

(56) References Cited

U.S. PATENT DOCUMENTS

2001/0020071 A1* 9/2001 Capote ................... C08G 59/36
257/E23.119

FOREIGN PATENT DOCUMENTS

| | | |
|---|---|---|
| JP | H11124433 | 5/1999 |
| JP | 2004168894 | 6/2004 |
| JP | 2014132326 | 7/2014 |
| JP | 2014521754 | 8/2014 |
| JP | 2018016793 | 2/2018 |
| JP | 6825368 | 2/2021 |
| JP | 6981522 | 12/2021 |
| TW | 202041572 | 11/2020 |
| TW | 202104374 | 2/2021 |
| WO | 2020189354 | 9/2020 |
| WO | 2020203834 | 10/2020 |

OTHER PUBLICATIONS

"Office Action of Taiwan Counterpart Application", issued on Nov. 25, 2024, with English translation thereof, p. 1- p. 16.
"Written Opinion of the International Searching Authority (Form PCT/ISA/237) of PCT/JP2021/040617," mailed on Jan. 18, 2022, with English translation thereof, pp. 1-10.
"International Search Report (Form PCT/ISA/210) of PCT/JP2021/040617", mailed on Jan. 18, 2022, with English translation thereof, pp. 1-6.
"Office Action of China Counterpart Application", issued on Jul. 25, 2025, with English translation thereof, p. 1-p. 14.

* cited by examiner

*Primary Examiner* — Camie S Thompson
(74) *Attorney, Agent, or Firm* — JCIPRNET

(57) ABSTRACT

Provided is a thermally curable resin composition which can give cured objects having low-dielectric characteristics, high heat resistance, a low modulus, and a low water absorption and which has satisfactory adhesiveness to substrates. The thermally curable resin composition comprises: a bismaleimide compound (A) including a constituent unit represented by formula (1) and containing maleimide groups at both ends of the molecular chain; a thermally curable resin or compound (B); and a polymerization initiator (C) and/or a curing accelerator (D).

15 Claims, No Drawings

THERMALLY CURABLE RESIN COMPOSITION, CURED OBJECT, RESIN SHEET, PREPREG, METAL-CLAD LAMINATE, MULTILAYERED PRINTED WIRING BOARD, SEALING MATERIAL, FIBER-REINFORCED COMPOSITE MATERIAL, ADHESIVE, AND SEMICONDUCTOR DEVICE

CROSS-REFERENCE TO RELATED APPLICATION

This application is a 371 application of the International PCT application serial no. PCT/JP2021/040617, filed on Nov. 4, 2021, which claims the priority benefits of Japan Patent Application No. 2021-052291, filed on Mar. 25, 2021. The entirety of each of the above-mentioned patent applications is hereby incorporated by reference herein and made a part of this specification.

TECHNICAL FIELD

The present invention relates to a thermally curable resin composition. More specifically, the present invention relates to a thermally curable resin composition that can be used as a sealing material for laminates such as print substrates and electronic components such as semiconductor devices.

BACKGROUND ART

In recent years, the development of higher-performance materials has been required, particularly with progress in the field of advanced materials. For example, for applications such as large-capacity communication instruments, antenna modules for smartphones, materials for cable systems for laptops, materials for millimeter-wave radar and auto brake device-related instruments for vehicles, demands for better dielectric characteristics, heat resistance, low stress, water resistance, adhesiveness and the like are increasing for electronic circuit substrates.

In the related art, cyanic acid ester resins are known as thermally curable resins having excellent heat resistance, a low dielectric constant, and a low dielectric loss. For example, Patent Literature 1 discloses a phenol novolac type cyanic acid ester resin as a resin having excellent heat resistance and storage stability. However, a cured object using the phenol novolac type cyanic acid ester resin described in Patent Literature 1 has excellent heat expansion resistance, but it may have a high water absorption rate and deteriorate dielectric characteristics.

Patent Literature 2 discloses, as a resin composition that forms a cured object having excellent mechanical strength, adhesive strength to adherends, film forming properties, heat resistance, and pressure resistance, a resin composition containing a polyamide imide resin, diphenylethane bismaleimide, and an allylphenolic resin. However, in the resin composition described in Patent Literature 2, since a thermoplastic high-molecular-weight polyamide imide resin is used, low-temperature meltability is poor and the compatibility between the polyamide imide resin and a maleimide compound is poor. Therefore, the resin composition may undergo phase separation when a coating film is cured, and it is difficult to obtain a uniform coating film.

In addition, since a high-boiling-point solvent such as NMP (N-methylpyrrolidone) is used, the solvent may remain in the B stage.

In addition, Patent Literature 3 discloses, as a resin composition that forms a cured object having favorable adhesiveness and excellent moisture resistance, an epoxy resin composition for semiconductor encapsulation containing an epoxy resin, an imidazole compound, and a maleimide compound. However, the resin composition described in Patent Literature 3 does not always have sufficient heat resistance due to the occurrence of cracks in the cured object when it receives stress due to a large temperature change in a temperature cycle test or the like.

CITATION LIST

Patent Literature

Patent Literature 1

Japanese Patent Laid-Open No. H11-124433

Patent Literature 2

Japanese Patent Laid-Open No. 2004-168894

Patent Literature 3

Published Japanese Translation No. 2014-521754 of the PCT International Publication

SUMMARY OF INVENTION

Technical Problem

The present invention has been made in view of the above problems in the related art, and an objective of the present invention is to provide a thermally curable resin composition, which is a low-viscosity curable resin composition, that can realize low-dielectric characteristics, high heat resistance, a low elastic modulus and a low water absorption rate as properties of a cured object, and has favorable adhesiveness to a substrate.

Solution to Problem

The inventors conducted studies in order to address the above problems, and as a result, found that the above problems can be addressed by the present invention to be described below.

That is, the present invention provides the following inventions.

[1] A thermally curable resin composition including a bismaleimide compound (A) including a constituent unit represented by the following Formula (1) and maleimide groups at both ends of a molecular chain, a thermally curable resin or compound (B) other than the bismaleimide compound (A), and a polymerization initiator (C) and/or a curing accelerator (D).

[Chem. 1]

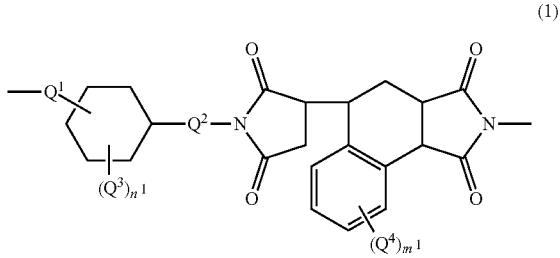

(1)

(in Formula (1), $Q^1$ indicates a linear or branched C1-C16 alkylene group or a linear or branched C2-C16 alkenylene group, $Q^2$ indicates a linear or branched C1-C16 alkylene group or a linear or branched C2-C16 alkenylene group, $Q^3$'s each independently indicate a hydrogen atom, a linear or branched C1-C16 alkyl group, or a linear or branched C2-C16 alkenyl group, $Q^4$'s each independently indicate a hydrogen atom, a linear or branched C1-C6 alkyl group, a halogen atom, a hydroxy group or a linear or branched C1-C6 alkoxy group, $n^1$'s each independently indicate an integer of 1 to 4, and $m^1$'s each independently indicate an integer of 1 to 4).

[2] The thermally curable resin composition according to [1], wherein the thermally curable resin or compound (B) further includes one or more selected from the group consisting of maleimide compounds other than the bismaleimide compound according to [1], a cyanic acid ester compound, a phenolic resin, an epoxy resin, an oxetane resin, a benzoxazine compound, a carbodiimide compound, and a compound having an ethylenically unsaturated group.

[3] The thermally curable resin composition according to [1] or [2],
wherein the polymerization initiator (C) includes a thermal radical polymerization initiator.

[4] The thermally curable resin composition according to any one of [1] to [3],
wherein the curing accelerator (D) includes at least one compound selected from the group consisting of phosphine compounds, compounds containing a phosphonium salt and imidazole compounds.

[5] The thermally curable resin composition according to any one of [1] to [4],
wherein the content of the bismaleimide compound (A) with respect to a total amount of 100 parts by mass of the bismaleimide compound (A) and the thermally curable resin or compound (B) is 1 part by mass to 99 parts by mass.

[6] The thermally curable resin composition according to any one of [1] to [5], further including a filling material.

[7] A cured object including the thermally curable resin composition according to any one of [1] to [6].

[8] A resin sheet including a support and a resin layer that is disposed on one surface or both surfaces of the support, wherein the resin layer contains the thermally curable resin composition according to any one of [1] to [6].

[9] A prepreg including a substrate and the thermally curable resin composition according to any one of [1] to [6] that is impregnated into or applied to the substrate.

[10] A metal-clad laminate including a layer containing at least one selected from the group consisting of the resin sheet according to [8] and the prepreg according to [9] and a metal foil that is provided on one surface or both surfaces of the layer, wherein the layer contains a cured object of the thermally curable resin composition.

[11] A multilayered printed wiring board including an insulating layer and a conductor layer that is formed on one surface or both surfaces of the insulating layer, wherein the insulating layer contains the thermally curable resin composition according to any one of [1] to [6].

[12] A sealing material including the thermally curable resin composition according to any one of [1] to [6].

[13] A fiber-reinforced composite material including the thermally curable resin composition according to any one of [1] to [6] and a reinforcing fiber.

[14] An adhesive including the thermally curable resin composition according to any one of [1] to [6].

[15] A semiconductor device including the thermally curable resin composition according to any one of [1] to [6].

Advantageous Effects of Invention

According to the present invention, it is possible to provide a thermally curable resin composition, which is a low-viscosity curable resin composition, that can realize low-dielectric characteristics, high heat resistance, a low elastic modulus and a low water absorption rate as properties of a cured object. When the thermally curable resin composition of the present invention having the above effects is used as a sealing material, it is possible to dramatically improve properties of laminates such as print substrates and electronic components such as semiconductor devices.

DESCRIPTION OF EMBODIMENTS

Hereinafter, preferable embodiments of the present invention will be described in detail.
[Bismaleimide Compound (A)]

A resin composition of the present embodiment includes a bismaleimide compound (A) according to the present embodiment (also referred to as a component (A)) including a constituent unit represented by Formula (1) and maleimide groups at both ends of a molecular chain.

[Chem. 2]

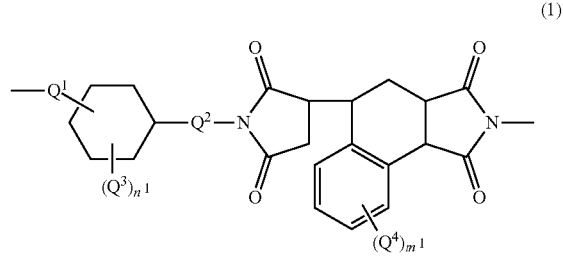

(1)

(in Formula (1), $Q^1$ indicates a linear or branched C1-C16 alkylene group or a linear or branched C2-C16 alkenylene group, $Q^2$ indicates a linear or branched C1-C16 alkylene group or a linear or branched C2-C16 alkenylene group, $Q^3$'s each independently indicate a hydrogen atom, a linear or branched C1-C16 alkyl group, or a linear or branched C2-C16 alkenyl group, $Q^4$'s each independently indicate a hydrogen atom, a linear or branched C1-C6 alkyl group, a halogen atom, a hydroxy group or a linear or branched C1-C6 alkoxy group, $n^1$'s each independently indicate an integer of 1 to 4, and $m^1$'s each independently indicate an integer of 1 to 4).

Since the bismaleimide compound (A) according to the present embodiment includes a constituent unit represented by Formula (1), it has very excellent transmittance and heat resistance. In addition, since it has radical polymerization-reactive maleimide groups at ends, in a curing procedure, the reaction between the maleimide group and polymerizable functional groups in the thermally curable resin or compound (B) to be described below, that is, a citraconimide group, a vinyl group, a maleimide group, a (meth)acryloyl group, and an allyl group, proceeds easily. Therefore, the crosslinking density of the obtained cured object increases, but the main framework is a flexible framework, and thus tackiness is excellent, and also, heat resistance (glass transition temperature) is improved. Thus, when the resin composition of the present embodiment contains the bismaleimide compound (A) according to the present embodiment together with the thermally curable resin or compound (B) to be described below and the curing accelerator (D) to be described below, as described above, it has low dielectric properties and excellent adhesiveness to substrates.

As described above, since the resin composition of the present embodiment has excellent balance of dielectric characteristics, adhesiveness, tackiness, transmittance, and heat resistance, it is suitable for underfill materials and can be more suitably used for pre-applied underfill materials. In addition, for example, in a resin having an epoxy group, a polar group having water absorption properties is generated after the reaction, but according to the bismaleimide compound (A) according to the present embodiment, a polar group having water absorption properties is not generated. Therefore, a cured object having low water absorption (humidity) and high insulation reliability can be obtained.

The bismaleimide compound (A) is not particularly limited as long as effects of the present invention are exhibited, and the mass average molecular weight is preferably 100 to 6,000, and more preferably 300 to 5,000 because a suitable viscosity can be obtained and an increase in viscosity of the varnish can be reduced. Here, in the present embodiment, the "mass average molecular weight" is a mass average molecular weight in terms of polystyrene standards according to a gel permeation chromatography (GPC) method.

Next, the structure of the bismaleimide compound (A) will be described.

In Formula (1), $Q^1$ indicates a linear or branched C1-C16 alkylene group or a linear or branched C2-C16 alkenylene group. $Q^1$ is preferably a linear or branched alkylene group and more preferably a linear alkylene group because a suitable viscosity can be obtained and an increase in viscosity of the varnish controlled.

The number of carbon atoms in the alkylene group is preferably 2 to 14 and more preferably 4 to 12 because a more suitable viscosity can be obtained and an increase in viscosity of the varnish can be better controlled.

Examples of linear or branched alkylene groups include a methylene group, ethylene group, propylene group, 2,2-dimethylpropylene group, butylene group, pentylene group, hexylene group, heptylene group, octylene group, nonylene group, decylene group, dodecylene group, undecylene group, tridecylene group, tetradecylene group, pentadecylene group, hexadecylene group, octadecylene group, neopentylene group, dimethylbutylene group, methylhexylene group, ethylhexylene group, dimethylhexylene group, trimethylhexylene group, methylheptylene group, dimethylheptylene group, trimethylheptylene group, tetramethylheptylene group, ethylheptylene group, methyloctylene group, methylnonylene group, methyldecylene group, methyldodecylene group, methylundecylene group, methyltridecylene group, methyltetradecylene group, methylpentadecylene group, and methylhexadecylene group. The number of carbon atoms in the alkenylene group is preferably 2 to 14 and more preferably 4 to 12 because a more suitable viscosity can be obtained and an increase in viscosity of the varnish can be better controlled.

Examples of linear or branched alkenylene groups include a vinylene group, 1-methyl vinylene group, arylene group, propenylene group, isopropenylene group, 1-butenylene group, 2-butenylene group, 1-pentenylene group, 2-pentenylene group, isopentenylene group, cyclopentenylene group, cyclohexenylene group, and dicyclopentadienylene group.

In Formula (1), $Q^2$ indicates a linear or branched C1-C16 alkylene group or a linear or branched C2-C16 alkenylene group. $Q^2$ is preferably a linear or branched alkylene group and more preferably a linear alkylene group because a suitable viscosity can be obtained and an increase in viscosity of the varnish controlled.

The number of carbon atoms in the alkylene group is preferably 2 to 14 and more preferably 4 to 12 because a more suitable viscosity can be obtained and an increase in viscosity of the varnish can be better controlled.

As the linear or branched alkylene group, $Q^2$ can be referred to.

The number of carbon atoms in the alkenylene group is preferably 2 to 14 and more preferably 4 to 12 because a more suitable viscosity can be obtained and an increase in viscosity of the varnish can be better controlled.

As the linear or branched alkenylene group, $Q^2$ can be referred to.

In Formula (1), $Q^1$ and $Q^2$ may be the same as or different from each other, and are preferably the same because the bismaleimide compound (A) can be more easily synthesized.

In Formula (1), $Q^3$'s each independently indicate a hydrogen atom, a linear or branched C1-C16 alkyl group, or a linear or branched C2-C16 alkenyl group. $Q^3$'s each independently preferably indicate a hydrogen atom or a linear or branched C1-C16 alkyl group because a suitable viscosity can be obtained and an increase in viscosity of the varnish controlled, and more preferably, 1 to 5 groups ($Q^3$) among $Q^3$'s are a linear or branched C1-C16 alkyl group, and the remaining groups ($Q^3$) are a hydrogen atom, and still more preferably, 1 to 3 groups ($Q^3$) among $Q^3$'s are a linear or branched C1-C16 alkyl group, and the remaining groups ($Q^3$) are a hydrogen atom.

The number of carbon atoms in the alkyl group is preferably 2 to 14 and more preferably 4 to 12 because a more suitable viscosity can be obtained and an increase in viscosity of the varnish can be better controlled.

Examples of linear or branched alkyl groups include a methyl group, ethyl group, n-propyl group, isopropyl group, n-butyl group, 2-butyl group, isobutyl group, tert-butyl group, n-pentyl group, 2-pentyl group, tert-pentyl group, 2-methylbutyl group, 3-methylbutyl group, 2,2-dimethylpropyl group, n-hexyl group, 2-hexyl group, 3-hexyl group, 2-methylpentyl group, 3-methylpentyl group, 4-methylpentyl group, and 2-methylpentan-3-yl group.

The number of carbon atoms in the alkenyl group is preferably 2 to 14 and more preferably 4 to 12 because a more suitable viscosity can be obtained and an increase in viscosity of the varnish can be better controlled.

Examples of linear or branched alkenyl groups include a vinyl group, allyl group, 4-pentenyl group, isopropenyl group, and isopentenyl group.

In Formula (1), $Q_4$'s each independently indicate a hydrogen atom, a linear or branched C1-C6 alkyl group, halogen atom, hydroxy group or a linear or branched C1-C6 alkoxy group. $Q_4$ is preferably a hydrogen atom or a linear or branched C1-C6 alkyl group in consideration of dielectric characteristics.

The number of carbon atoms in the alkyl group is preferably 1 to 6 and more preferably 1 to 3 because a more suitable viscosity can be obtained.

Examples of linear or branched alkyl groups include a methyl group, ethyl group, n-propyl group, and isopropyl group.

Examples of halogen atoms include fluorine atoms, chlorine atoms, bromine atoms, and iodine atoms.

The number of carbon atoms in the alkoxy group is preferably 1 to 6 and more preferably 1 to 3 because a more suitable viscosity can be obtained.

Examples of linear or branched alkoxy groups include a methoxy group, ethoxy group, n-propoxy group, and isopropoxy group.

In Formula (1), $n^1$'s each independently indicate an integer of 1 to 2. $m^1$'s each independently indicate an integer of 1 to 4.

[Chem. 3]

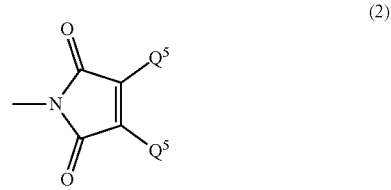

In Formula (2), $Q^5$'s each independently indicate a hydrogen atom or a linear or branched C1-C4 alkyl group. Both $Q^5$'s are preferably hydrogen atoms in consideration of suitable curing.

The number of carbon atoms in the alkyl group is preferably 1 to 3 and more preferably 1 to 2 in consideration of suitable curing.

As the linear or branched alkyl group, $Q^3$ can be referred to.

Examples of such a bismaleimide compound (A) include maleimide compounds represented by Formula (3).

[Chem. 4]

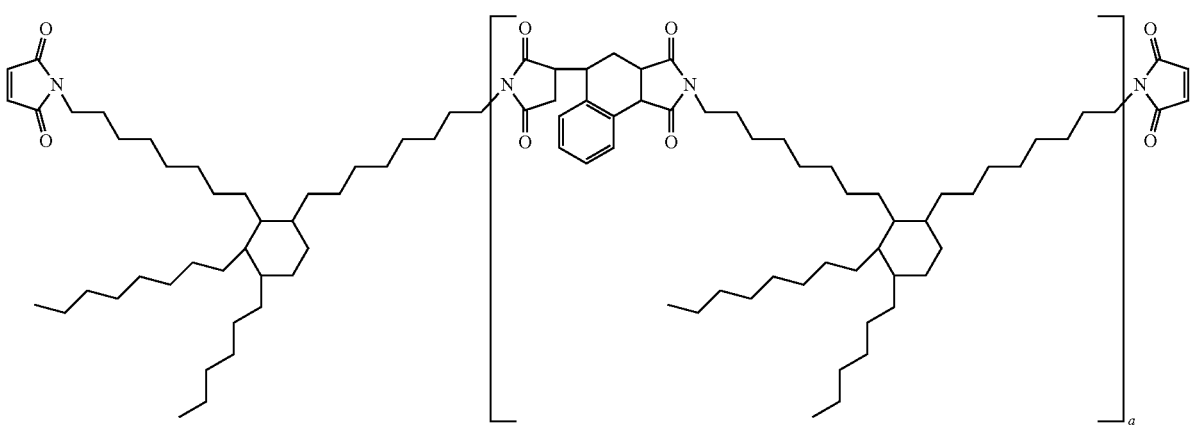

The bismaleimide compound (A) has maleimide groups at both ends of a molecular chain. In the present embodiment, "both ends" means ends at both sides in the molecular chain of the bismaleimide compound (A), and for example, it means that, when the structural unit represented by Formula (1) is at the end of the molecular chain of the bismaleimide compound (A), the maleimide group is provided at the end of the molecular chain of $Q^1$, at the end of the molecular chain at the N atom of the maleimide ring, or at both ends. The bismaleimide compound (A) may have maleimide groups at positions other than both ends of the molecular chain.

In the present embodiment, the maleimide group is represented by the following Formula (2), and an N atom is bonded to the molecular chain of Formula (1). In addition, the maleimide groups bonded to Formula (1) may all be the same as or different from each other, and maleimide groups at both ends of a molecular chain are preferably the same.

In Formula (3), a indicates an integer of 1 to 10. a is preferably an integer of 1 to 6 because a more suitable viscosity can be obtained and an increase in viscosity of the varnish can be better controlled.

In the resin composition of the present embodiment, the content of the bismaleimide compound (A) is not particularly limited. The content is preferably 1 part by mass to 99 parts by mass, more preferably 3 parts by mass to 95 parts by mass, still more preferably 5 parts by mass to 90 parts by mass, yet more preferably 10 parts by mass to 85 parts by mass, and particularly preferably 15 parts by mass to 85 parts by mass with respect to a total of 100 parts by mass of the bismaleimide compound (A) and a radically polymerizable resin or compound (B) to be described below because it is possible to obtain a cured object mainly composed of a bismaleimide compound, curability is further improved, and further reducing the number of voids are obtained.

The bismaleimide compounds (A) can be used alone or two or more thereof can be appropriately used in combination.

(Method of Producing Bismaleimide Compound (A))

The bismaleimide compound (A) according to the present embodiment can be produced by a known method. For example, a bismaleimide compound (A) can be obtained by subjecting 4-(2,5-dioxotetrahydrofuran-3-yl)-1,2,3,4-tetrahydronaphthalene-1,2-dicarboxylic anhydride, monomers containing diamines, including dimer diamines and the like, and a maleimide compound to a polyaddition reaction at a temperature of generally 80° C. to 250° C., and preferably 100° C. to 200° C., for generally 0.5 hours to 50 hours, and preferably 1 hours to 20 hours to obtain a polyadduct, and then subjecting the polyadduct to an imidization reaction, that is, a dehydrative ring-closing reaction, at a temperature of generally 60° C. to 120° C., and preferably 80° C. to 100° C. for generally 0.1 hours to 2 hours, and preferably 0.1 hours to 0.5 hours.

Dimer diamines are obtained according to, for example, a reductive amination reaction of dimer acids, and the amination reaction can be performed, for example, by known methods (for example, the method described in Japanese Patent Laid-Open No. H9-12712) such as a reduction method using ammonia and a catalyst. Dimer acids are dibasic acids obtained by dimerizing unsaturated fatty acids according to an intermolecular polymerization reaction or the like. Although it depends on synthesis conditions and purification conditions, in addition to dimer acids, a small amount of monomer acids, trimer acids and the like is generally contained. Although double bonds remain in the obtained molecule after the reaction, in the present embodiment, the dimer acids include a saturated dibasic acid obtained by reducing the number of double bonds present in the molecule according to a hydrogenation reaction. Dimer acids are obtained by, for example, polymerizing unsaturated fatty acids using a Lewis acid and a Bronsted acid as a catalyst. Dimer acids can be produced by a known method (for example, the method described in Japanese Patent Laid-Open No. H9-12712). Examples of unsaturated fatty acids include crotonic acid, myristoleic acid, palmitoleic acid, oleic acid, elaidic acid, vaccenic acid, gadoleic acid, eicosenoic acid, erucic acid, nervonic acid, linoleic acid, pinolenic acid, eleostearic acid, mead acid, dihomo-γ-linolenic acid, eicosatrienoic acid, stearidonic acid, arachidonic acid, eicosatetraenoic acid, adrenic acid, bosseopentaenoic acid, osbond acid, clupanodonic acid, tetracosapentaenoic acid, docosahexaenoic acid, and nisinic acid. The number of carbon atoms in the unsaturated fatty acid is generally 4 to 24, and preferably 14 to 20.

In the production of the bismaleimide compound (A), monomers containing diamine are preferably dissolved or dispersed in a slurry form in advance in an organic solvent, for example, in an inert atmosphere of argon, nitrogen or the like, to form a monomer solution containing diamine. Then, 4-(2,5-dioxotetrahydrofuran-3-yl)-1,2,3,4-tetrahydronaphthalene-1,2-dicarboxylic anhydride that has been dissolved or dispersed in a slurry form in an organic solvent or that is in a solid state is preferably added to the monomer solution containing diamine.

Any bismaleimide compound (A) can be obtained by adjusting the number of moles of 4-(2,5-dioxotetrahydrofuran-3-yl)-1,2,3,4-tetrahydronaphthalene-1,2-dicarboxylic anhydride and the number of moles of the total amount of monomers containing diamine and the maleimide compound.

Various known solvents can be used in a polyaddition reaction and an imidization reaction. The solvent is not particularly limited, and examples thereof include amides such as N,N-dimethylformamide, N,N-dimethylacetamide, and N-methyl-2-pyrrolidone; ketones such as acetone, methyl ethyl ketone, methyl isobutyl ketone, cyclohexanone, and isophorone; esters such as γ-butyrolactone, γ-valerolactone, δ-valerolactone, γ-caprolactone, ε-caprolactone, α-methyl-γ-butyrolactone, ethyl lactate, methyl acetate, ethyl acetate, and butyl acetate; C1-C10 aliphatic alcohols such as methanol, ethanol, and propanol; aromatic group-containing phenols such as phenol and cresol; aromatic group-containing alcohols such as benzyl alcohol; glycol ethers such as glycols such as ethylene glycol and propylene glycol, or glycols thereof, and monoethers or diethers with methanol, ethanol, butanol, hexanol, octanol, benzyl alcohol, phenol, cresol, and the like, or esters of these monoethers; cyclic ethers such as dioxane and tetrahydrofuran; cyclic carbonates such as ethylene carbonate, and propylene carbonate; aromatic hydrocarbons such as aliphatic hydrocarbon, toluene, and xylene; and aprotic polar solvents such as dimethyl sulfoxide. These solvents can be used alone or two or more thereof can be used in combination as necessary.

In addition, in the imidization reaction, a catalyst is preferably used. The catalyst is not particularly limited, and for example, a tertiary amine and a dehydration catalyst can be used. As the tertiary amine, a heterocyclic tertiary amine is preferable, and examples thereof include pyridine, picoline, quinoline, and isoquinoline. The dehydration catalyst is not particularly limited, and examples thereof include acetic anhydride, propionic anhydride, n-butyric anhydride, benzoic anhydride, and trifluoroacetic anhydride.

The amount of the catalyst added is not particularly limited, and for example, preferably, the amount of the imidization agent is 0.5-fold molar to 5.0-fold molar equivalent that of the amide group, and the amount of the dehydration catalyst is 0.5-fold molar to 10.0-fold molar equivalent that of the amide group.

After the imidization reaction is completed, this solution may be used as the bismaleimide compound (A) solution, or a poor solvent may be added to the reaction solvent to form the bismaleimide compound (A) into a solid. The poor solvent is not particularly limited, and examples thereof include water, methyl alcohol, ethyl alcohol, 2-propyl alcohol, ethylene glycol, triethyleneglycol, 2-butyl alcohol, 2-pentyl alcohol, 2-hexyl alcohol, cyclopentyl alcohol, cyclohexyl alcohol, phenol, and t-butyl alcohol.

[Resin Composition]

The resin composition of the present embodiment contains the bismaleimide compound (A) of the present embodiment. In such a configuration, the resin composition of the present embodiment can exhibit excellent adhesiveness to chips, substrates and the like. In the present embodiment, in order to obtain better adhesiveness to chips, substrates and the like, the content of the maleimide compound (A) of the present embodiment with respect to 100 parts by mass of the resin composition of the present embodiment, is preferably 5 parts by mass or more and more preferably 10 parts by mass or more. The content of the bismaleimide compound (A) of the present embodiment is not particularly limited, and is, for example, 90 parts by mass or less.

[Thermally Curable Resin or Compound (B)]

The resin composition of the present embodiment may further contain, as the thermally curable resin or compound (B), one or more selected from the group consisting of maleimide compounds (hereinafter referred to as "other maleimide compounds") other than the bismaleimide compound (A) of the present embodiment, a cyanic acid ester compound, a phenolic resin, an epoxy resin, an oxetane resin, a benzoxazine compound, a carbodiimide compound, and a compound having an ethylenically unsaturated group. Hereinafter, these components will be described.

(Other Maleimide Compounds)

Other maleimide compounds are compounds other than the bismaleimide compound (A) of the present embodiment, and are not particularly limited as long as they are compounds having one or more maleimide groups in the molecule, and specific examples thereof include N-phenyl maleimide, N-cyclohexyl maleimide, N-hydroxy phenyl maleimide, N-carboxyphenyl maleimide, N-(4-carboxy-3-hydroxyphenyl)maleimide, 6-maleimide hexanoic acid, 4-maleimide butyric acid, bis(4-maleimide phenyl)methane, 2,2-bis{4-(4-maleimide phenoxy)-phenyl}propane, 4,4-diphenylmethane bismaleimide, bis(3,5-dimethyl-4-maleimide phenyl)methane, bis(3-ethyl-5-methyl-4-maleimide phenyl)methane, bis(3,5-diethyl-4-maleimide phenyl)methane, phenylmethane maleimide, o-phenylene bismaleimide, m-phenylene bismaleimide, p-phenylene bismaleimide, o-phenylene biscitraconimide, m-phenylene biscitraconimide, p-phenylenebiscitraconimide, 2,2-bis(4-(4-maleimide phenoxy)-phenyl)propane, 3,3-dimethyl-5,5-diethyl-4,4-diphenylmethane bismaleimide, 4-methyl-1,3-phenylene bismaleimide, 1,2-bismaleimide ethane, 1,4-bismaleimide butane, 1,6-bismaleimide hexane, 1,6-bismaleimido-(2,2,4-trimethyl)hexane, 1,8-bismaleimide-3,6-dioxaoctane, 1,11-bismaleimide-3,6,9-trioxaundecane, 1,3-bis(maleimide methyl)cyclohexane, 1,4-bis(maleimide methyl)cyclohexane, 4,4-diphenyl ether bismaleimide, 4,4-diphenylsulfone bismaleimide, 1,3-bis(3-maleimide phenoxy)benzene, 1,3-bis(4-maleimide phenoxy)benzene, 4,4-diphenylmethanebiscitraconimide, 2,2-bis[4-(4-citraconimidophenoxy)phenyl]propane, bis(3,5-dimethyl-4-citraconimidophenyl)methane, bis(3-ethyl-5-methyl-4-citraconimidophenyl)methane, bis(3,5-diethyl-4-citraconimidophenyl)methane, polyphenylmethane maleimide, maleimide compounds represented by the following Formula (4), maleimide compounds represented by the following Formula (5), maleimide compounds represented by the following Formula (6), maleimide compounds represented by the following Formula (7), maleimide compounds represented by the following Formula (8), maleimide compounds represented by the following Formula (9), maleimide compounds represented by the following Formula (10), maleimide compounds represented by the following Formula (11), maleimide compounds represented by the following Formula (12), 1,6-bismaleimido-(2,2,4-trimethyl)hexane (maleimide compounds represented by the following Formula (13)), maleimide compounds represented by the following Formula (14), and fluorescein-5-maleimide, prepolymers of these maleimide compounds and prepolymers of maleimide compounds and amine compounds. These other maleimide compounds can be used alone or two or more thereof can be appropriately used in combination.

[Chem. 5]

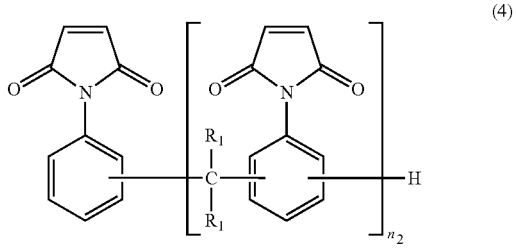

(4)

In Formula (4), a plurality of $R_1$'s each independently indicate a hydrogen atom or a methyl group. $n_2$ indicates an integer of 1 or more, preferably an integer of 1 to 10, and more preferably an integer of 1 to 5.

[Chem. 6]

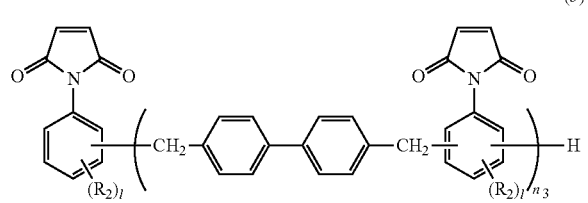

(5)

In Formula (5), $R_2$'s each independently indicate a hydrogen atom, a C1-C5 alkyl group, or a phenyl group, l's each independently indicate an integer of 1 to 3, and $n_3$ indicates an integer of 1 to 10.

Examples of C1-C5 alkyl groups include a methyl group, ethyl group, n-propyl group, isopropyl group, n-butyl group, isobutyl group, sec-butyl group, t-butyl group, n-pentyl group, and neopentyl group.

[Chem. 7]

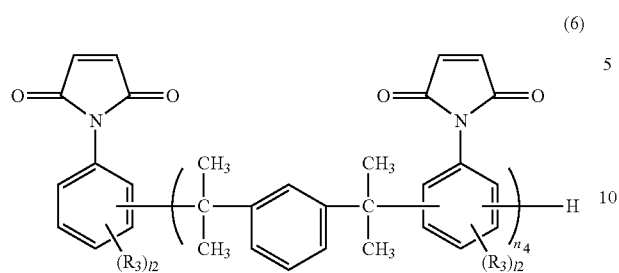

(6)

In Formula (6), $R_3$'s each independently indicate a hydrogen atom, a C1-C5 alkyl group, or a phenyl group, $l_2$'s each independently indicate an integer of 1 to 3, and $n_4$ indicates an integer of 1 to 10.

Examples of C1-C5 alkyl groups include a methyl group, ethyl group, n-propyl group, isopropyl group, n-butyl group, isobutyl group, sec-butyl group, t-butyl group, n-pentyl group, and neopentyl group.

[Chem. 8]

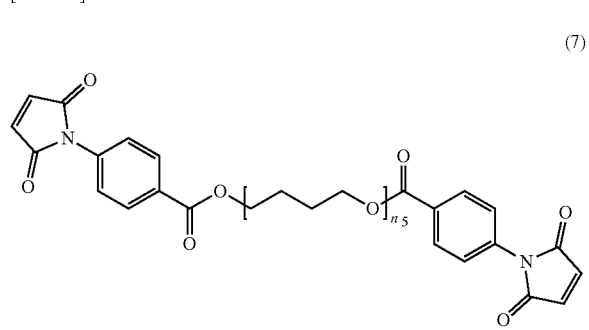

(7)

In Formula (7), $n_5$ (average) is 1 or more, preferably 1 to 21, and more preferably 1 to 16 because excellent photocurability is exhibited.

[Chem. 9]

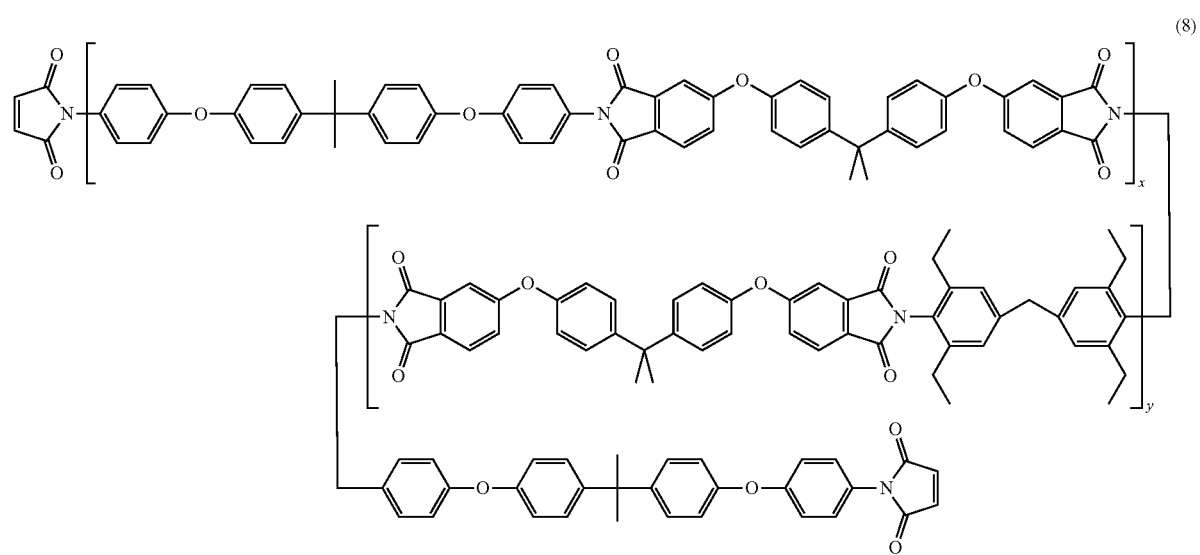

(8)

In Formula (8), the number of x is 10 to 35.
In Formula (8), the number of y is 10 to 35.

[Chem. 10]

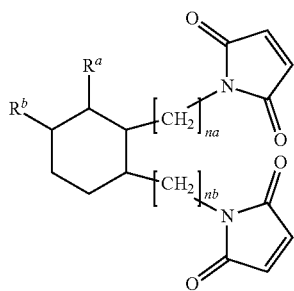

(9)

In Formula (9), $R^a$ indicates a linear or branched C1-C16 alkyl group or a linear or branched C1-C16 alkenyl group. $R^a$ is preferably a linear or branched alkyl group and more preferably a linear alkyl group because excellent photocurability is exhibited.

The number of carbon atoms in the alkyl group is preferably 1 to 16 and more preferably 4 to 12 because excellent photocurability is exhibited.

The number of carbon atoms in the alkenyl group is preferably 1 to 16 and more preferably 4 to 12 because excellent photocurability is exhibited.

As the linear or branched alkyl group, the description for $Q^3$ in Formula (1) can be referred to. Among these, an n-heptyl group, n-octyl group, and n-nonyl group are preferable, and an n-octyl group is more preferable because excellent photocurability is exhibited.

In Formula (9), $R^b$ indicates a linear or branched C1-C16 alkyl group or a linear or branched C1-C16 alkenyl group. $R^b$ is preferably a linear or branched alkyl group and more preferably a linear alkyl group because excellent photocurability is exhibited.

The number of carbon atoms in the alkyl group is preferably 1 to 16 and more preferably 4 to 12 because excellent photocurability is exhibited.

The number of carbon atoms in the alkenyl group is preferably 1 to 16 and more preferably 4 to 12 because excellent photocurability is exhibited.

As specific examples of alkyl groups, the alkyl groups for the above $R^a$ can be referred to. Among these, an n-heptyl group, n-octyl group, and n-nonyl group are preferable, and an n-octyl group is more preferable because excellent photocurability is exhibited.

As specific examples of alkenyl groups, the alkenyl groups for the above $R^a$ can be referred to. Among these, a 2-heptenyl group, 2-octenyl group, and 2-nonenyl group are preferable, and a 2-octenyl group is more preferable because excellent photocurability is exhibited.

In Formula (9), the number of n a is 1 or more, preferably 2 to 16, and more preferably 3 to 14 because excellent photocurability is exhibited.

In Formula (9), the number of $n_b$ is 1 or more, preferably 2 to 16, and more preferably 3 to 14 because excellent photocurability is exhibited.

The numbers of $n_a$ and $n_b$ may be the same as or different from each other.

[Chem. 11]

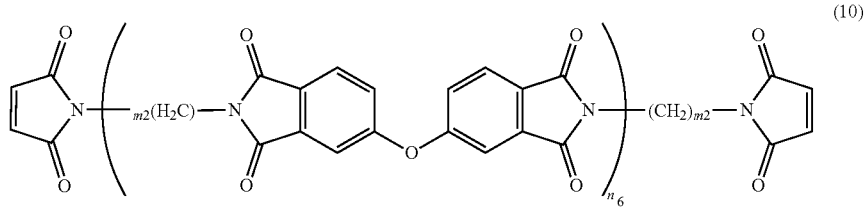

(10)

In Formula (10), $n_6$ indicates an integer of 1 to 10, and $m_2$ indicates an integer of 8 to 40.

[Chem. 12]

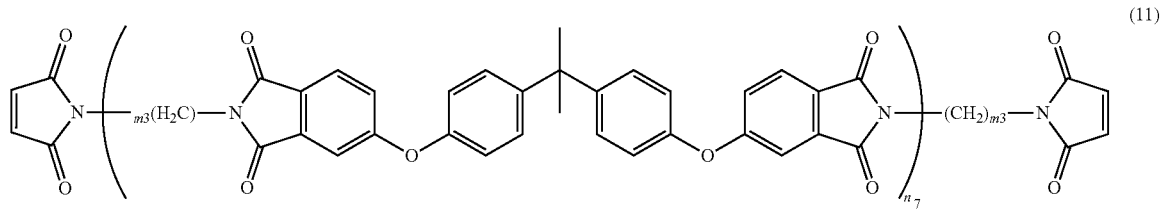

(11)

In Formula (11), $n_7$ indicates an integer of 1 to 10, and $m_3$ indicates an integer of 8 to 40.

[Chem. 13]

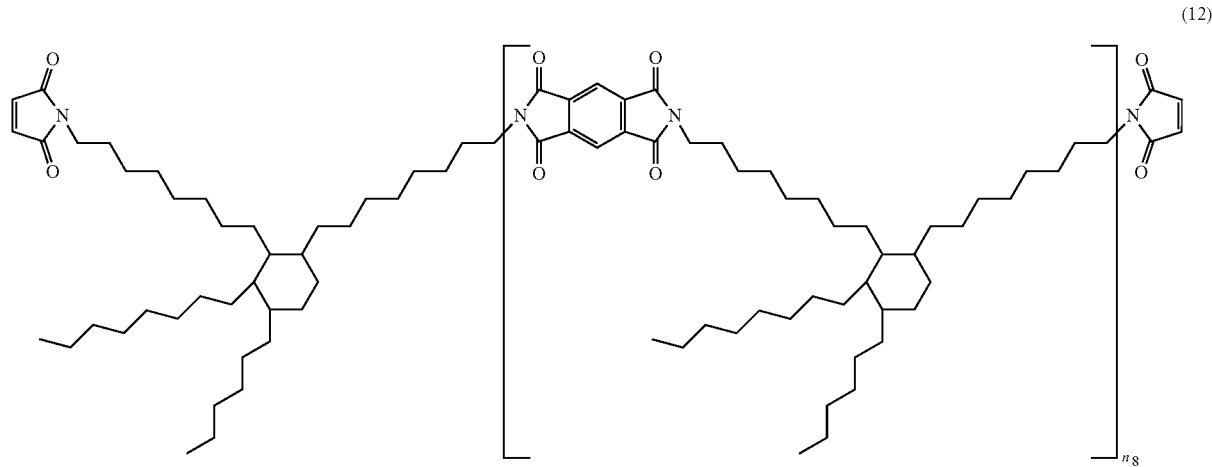

(12)

In Formula (12), $n_8$ indicates an integer of 1 or more, and preferably indicates an integer of 1 to 10.

[Chem. 14]

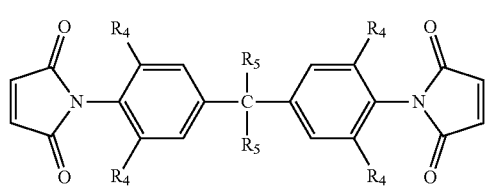

(13)

[Chem. 15]

(14)

(in Formula (14), $R_4$'s each independently indicate a hydrogen atom, a methyl group, or an ethyl group, and $R_5$'s each independently indicate a hydrogen atom or a methyl group.)

As other maleimide compounds, commercial products can also be used.

Examples of maleimide compounds represented by Formula (4) include BMI-2300 (product name, commercially available from Daiwa Fine Chemicals Co., Ltd.).

Examples of maleimide compounds represented by Formula (5) include MIR-3000 (product name, commercially available from Nippon Kayaku Co., Ltd.).

Examples of maleimide compounds represented by Formula (6) include MIR-5,000 (product name, commercially available from Nippon Kayaku Co., Ltd.).

Examples of maleimide compounds represented by Formula (7) include BMI-1000P (product name, in Formula (7), $n_5$=13.6 (average), commercially available from KI Chemical Industry Co., Ltd.), BMI-650P (product name, in Formula (7), $n_5$=8.8 (average), commercially available from KI Chemical Industry Co., Ltd.), BMI-250P (product name, in Formula (7), $n_5$=3 to 8 (average), commercially available from KI Chemical Industry Co., Ltd.), and CUA-4 (product name, in Formula (7), $n_5$=1, commercially available from KI Chemical Industry Co., Ltd.).

Examples of maleimide compounds represented by Formula (8) include BMI-6100 (product name, in Formula (11), x=18, y=18, commercially available from Designer Molecules Inc.).

Examples of maleimide compounds represented by Formula (9) include BMI-689 (product name, the following Formula (15), functional group equivalent: 346 g/eq., commercially available from Designer Molecules Inc.).

[Chem. 16]

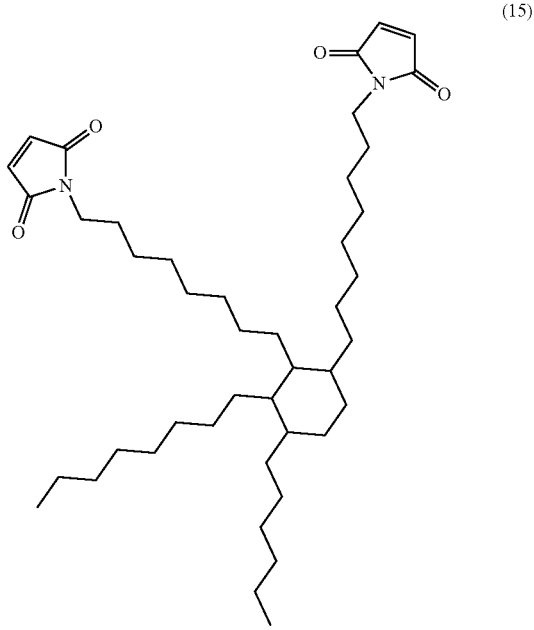

(15)

Examples of maleimide compounds represented by Formula (10) include BMI-1500 (product name, in Formula (10), $n_6=1.3$, functional group equivalent: 754 g/eq., commercially available from Designer Molecules Inc.).

As the maleimide compounds represented by Formula (11), commercial products can be used, and examples thereof include BMI-1700 (product name, commercially available from Designer Molecules Inc. (DMI)).

As the maleimide compounds represented by Formula (12), commercial products can be used, and examples thereof include BMI-3000 (product name, commercially available from Designer Molecules Inc. (DMI)), BMI-5000 (product name, commercially available from Designer Molecules Inc. (DMI)), and BMI-9000 (product name, commercially available from Designer Molecules Inc. (DMI)).

As the maleimide compounds represented by Formula (13), commercial products can be used, and examples thereof include BMI-TMH (product name, commercially available from Daiwa Fine Chemicals Co., Ltd.).

As the maleimide compounds represented by Formula (14), commercial products can be used, and examples thereof include BMI-70 (product name, commercially available from KI Chemical Industry Co., Ltd.).

The other maleimide compounds can be used alone or two or more thereof can be appropriately used in combination.

In the resin composition according to the present embodiment, a total content of other maleimide compounds other than the bismaleimide compound (A) of the present embodiment is not particularly limited, and the total content with respect to 100 parts by mass of the resin solid component in the resin composition of the present embodiment is preferably 0.01 to 95 parts by mass and more preferably 1 to 90 parts by mass because better adhesiveness to chips, substrates and the like are obtained.

(Cyanic Acid Ester Compound)

The cyanic acid ester compound is not particularly limited as long as it is a resin having an aromatic moiety in which at least one cyanato group (cyanic acid ester group) is substituted in the molecule.

For example, those represented by the following Formula (16) may be exemplified.

[Chem. 17]

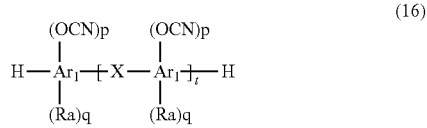

(16)

In Formula (16), $Ar_1$ indicates a benzene ring, a naphthalene ring or a single bond of two benzene rings. If there are a plurality of $Ar_1'$, they may be the same as or different from each other. Ra's each independently indicate a hydrogen atom, a C1-C6 alkyl group, a C1-C6 alkenyl group, a C6-C12 aryl group, a C1-C4 alkoxy group, or a group in which a C1-C6 alkyl group and a C6-C12 aryl group are bonded. The aromatic ring for $R^a$ may have a substituent, and substituents for $Ar_1$ and $R^a$ can be selected at arbitrary positions. p indicates the number of cyanato groups bonded to $Ar_1$, and each independently indicate an integer of 1 to 3. q indicates the number of $R^a$ atoms bonded to Ar1 and is 4-p when $Ar_1$ is a benzene ring, 6-p when $Ar_1$ is a naphthalene ring, and 8-p when two benzene rings are single-bonded. t indicates an average number of repetitions, and is an integer of 0 to 50, and the cyanic acid ester compound may be a mixture of compounds with different t. When there are a plurality of X's, they each independently indicate a single bond, a C1-050 divalent organic group (a hydrogen atom may be substituted with a hetero atom), a divalent organic group having 1 to 10 nitrogen atoms (for example, —N—R—N— (here, R indicates an organic group)), a carbonyl group (—CO—), a carboxy group (—C(=O)O—), a carbonyl dioxide group (—OC(=O)O—), a sulphonyl group (—SO$_2$—), a divalent sulfur atom or a divalent oxygen atom.

The alkyl group for $R^a$ in Formula (16) may have either a linear or branched chain structure or a cyclic structure (for example, a cycloalkyl group, etc.).

In addition, a hydrogen atom in the alkyl group in Formula (16) and the aryl group for $R^a$ may be substituted with a halogen atom such as a fluorine atom and a chlorine atom, an alkoxy group such as a methoxy group and a phenoxy group, a cyano group or the like.

Specific examples of alkyl groups include a methyl group, ethyl group, propyl group, isopropyl group, n-butyl group, isobutyl group, tert-butyl group, n-pentyl group, 1-ethyl propyl group, 2,2-dimethylpropyl group, cyclopentyl group, hexyl group, cyclohexyl group, and trifluoromethyl group.

Specific examples of alkenyl groups include a vinyl group, (meth)allyl group, isopropenyl group, 1-propenyl group, 2-butenyl group, 3-butenyl group, 1,3-butandienyl group, 2-methyl-2-propenyl, 2-pentenyl group, and 2-hexenyl group.

Specific examples of aryl groups include a phenyl group, xylyl group, mesityl group, naphthyl group, phenoxy phenyl group, ethyl phenyl group, o-, m- or p-fluoro phenyl group, dichloro phenyl group, dicyano phenyl group, trifluoro phenyl group, methoxy phenyl group, and o-, m- or p-tolyl group.

Examples of alkoxy groups include a methoxy group, ethoxy group, propoxy group, isopropoxy group, n-butoxy group, isobutoxy group, and tert-butoxy group.

Specific examples of C1-C50 divalent organic groups for X in Formula (16) include a methylene group, ethylene group, trimethylene group, cyclopentylene group, cyclohexylene group, trimethylcyclohexylene group, biphenylylmethylene group, dimethylmethylene-phenylene-dimethylmethylene group, fluorenediyl group, and phthalidodiyl group. A hydrogen atom in the divalent organic group may be substituted with a halogen atom such as a fluorine atom and a chlorine atom, an alkoxy group such as a methoxy group and a phenoxy group, a cyano group or the like.

Examples of divalent organic groups having 1 to 10 nitrogen atoms for X in Formula (16) include imino groups and polyimide groups.

In addition, examples of organic groups for X in Formula (16) include those having a structure represented by the following Formula (17) or the following Formula (18).

[Chem. 18]

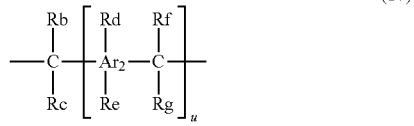

(17)

In Formula (17), $Ar_2$ indicates a benzenediyl group, a naphthalenediyl group or a biphenyldiyl group, and if u is 2 or more, they may be the same as or different from each other. Rb, Rc, Rf, and Rg each independently indicate a hydrogen atom, a C1-C6 alkyl group, a C6-C12 aryl group, a trifluoromethyl group, or an aryl group having at least one phenolic hydroxy group. Rd and Re are each independently selected from among a hydrogen atom, a C1-C6 alkyl group, a C6-C12 aryl group, a C1-C4 alkoxy group, and a hydroxy group. u indicates an integer of 0 to 5.

[Chem. 19]

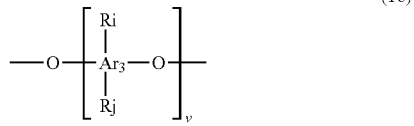

(18)

In Formula (18), $Ar_3$ indicates a benzenediyl group, a naphthalenediyl group or a biphenyldiyl group, and if v is 2 or more, they may be the same as or different from each other.

Ri and Rj each independently indicate a hydrogen atom, a C1-C6 alkyl group, a C6-C12 aryl group, benzyl group, a C1-C4 alkoxy group, a hydroxy group, a trifluoromethyl group, or an aryl group in which at least one cyanato group is substituted. v indicates an integer of 0 to 5, and a mixture of compounds with different v may be used.

In addition, as X in Formula (16), divalent groups represented by the following formula may be exemplified.

[Chem. 20]

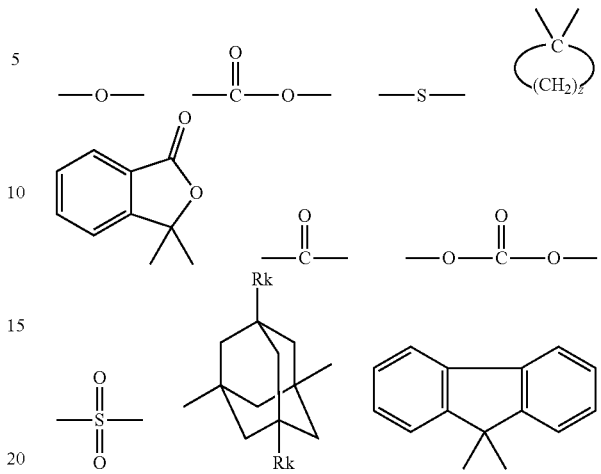

Here, in the above formula, z indicates an integer of 4 to 7. Rk's each independently indicate a hydrogen atom or a C1-C6 alkyl group.

Specific examples of $Ar_2$ in Formula (17) and $Ar_3$ in Formula (18) include benzenediyl groups in which two carbon atoms represented by Formula (17) or two oxygen atoms represented by Formula (18) are bonded to the 1,4 positions or 1,3 positions, biphenyl diyl groups in which the two carbon atoms or two oxygen atoms are bonded to the 4,4' positions, 2,4' positions, 2,2' positions, 2,3' positions, 3,3' positions, or 3,4' positions, and naphthalenediyl groups in which the two carbon atoms or two oxygen atoms are bonded to the 2,6 positions, 1,5 positions, 1,6 positions, 1,8 positions, 1,3 positions, 1,4 positions, or 2,7 positions.

The alkyl groups and aryl groups for Rb, Rc, Rd, Re, Rf and Rg in Formula (17) and Ri and Rj in Formula (18) have the same meanings as in Formula (16).

Specific examples of cyanato-substituted aromatic compounds represented by Formula (16) include cyanatobenzene, 1-cyanato-2-, 1-cyanato-3-, or 1-cyanato-4-methylbenzene, 1-cyanato-2-, 1-cyanato-3-, or 1-cyanato-4-methoxybenzene, 1-cyanato-2,3-,1-cyanato-2,4-,1-cyanato-2,5-,1-cyanato-2,6-,1-cyanato-3,4- or 1-cyanato-3,5-dimethylbenzene, cyanatoethylbenzene, cyanatobutylbenzene, cyanatooctylbenzene, cyanatononylbenzene, 2-(4-cyanaphenyl)-2-phenylpropane (4-α-cumylphenol cyanate), 1-cyanato-4-cyclohexylbenzene, 1-cyanato-4-vinylbenzene, 1-cyanato-2- or 1-cyanato-3-chlorobenzene, 1-cyanato-2,6-dichlorobenzene, 1-cyanato-2-methyl-3-chlorobenzene, cyanatonitrobenzene, 1-cyanato-4-nitro-2-ethylbenzene, 1-cyanato-2-methoxy-4-allylbenzene (eugenol cyanate), methyl(4-cyanatophenyl) sulfide, 1-cyanato-3-trifluoromethylbenzene, 4-cyanatobiphenyl, 1-cyanato-2- or 1-cyanato-4-acetylbenzene, 4-cyanatobenzaldehyde, 4-cyanatobenzoic acid methyl ester, 4-cyanatobenzoic acid phenyl ester, 1-cyanato-4-acetaminobenzene, 4-cyanatobenzophenone, 1-cyanato-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-dimethylbenzene, 1,3-dicyanato-2,4,6-trimethylbenzene, 1,3-dicyanato-5-methylbenzene, 1-cy anato or 2-cyanatonaphthalene, 1-cyanato-4-methoxynaphthalene, 2-cyanato-6-methoxynaphthalene, 2-cyanato-7-methoxynaphthalene, 2,2'-dicyanato-1,1'-binaphthyl, 1,3-, 1,4-, 1,5-, 1,6-, 1,7-, 2,3-, 2,6- or 2,7-dicyanatonaphthalene, 2,2'- or 4,4'-dicyanatobiphenyl, 4,4'-dicyanatooctafluorobiphenyl, 2,4'- or 4,4'-dicyanatodiphenylmethane, bis(4-cyanato-3,5-dimethylphenyl)methane, 1,1-bis(4-cyanatophenyl)ethane, 1,1-bis(4-cyanatophenyl)propane, 2,2-bis(4-cyanatophenyl)propane, 2,2-bis(4-cyanato-3-methylphenyl)propane, 2,2-bis(2-cyanato-5-biphenylyl)propane, 2,2-bis(4-cyanatophenyl)hexafluoropropane, 2,2-bis(4-cyanato-3,5-dimethylphenyl)propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl)butane, 2,2-bis(4-cyanatophenyl)pentane, 2,2-bis(4-cyanatophenyl)hexane, 2,2-bis(4-cyanatophenyl)-3-methylbutane, 2,2-bis(4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoro propane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl)cyclopentane, 1,1-bis(4-cyanatophenyl)cyclohexane, 2,2-bis(4-cyanato-3-isopropylphenyl)propane, 1,1-bis(3-cyclohexyl-4-cyanatophenyl)cyclohexane, bis(4-cyanatophenyl)diphenylmethane, bis(4-cyanatophenyl)-2,2-dichloroethylene, 1,3-bis[2-(4-cyanatophenyl)-2-propyl]benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propen-1-one, bis(4-cyanatophenyl)ether, bis(4-cyanatophenyl) sulfide, bis(4-cyanatophenyl)sulfone, 4-cyanatobenzoic acid-4-cyanatophenyl ester(4-cyanatophenyl-4-cyanatobenzoate), bis-(4-cyanatophenyl)carbonate, 1,3-bis(4-cyanatophenyl) adamantane, 1,3-bis(4-cyanatophenyl)-5,7-dimethyladamantane, 3,3-bis(4-cyanatophenyl)isobenzofuran-1(3H)-one (phenolphthalein cyanate), 3,3-bis(4-cyanato-3-methylphenyl)isobenzofuran-1(3H)-one (o-cresolphthalein cyanate), 9,9'-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1-tris(4-cyanatophenyl)ethane, 1,1,3-tris(4-cyanatophenyl)propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4'-oxydiphthalimide, bis(N-3-cyanato-4-methylphenyl)-4,4'-oxydiphthalimide, bis(N-4-cyanatophenyl)-4,4'-oxydiphthalimide, bis(N-4-cyanato-2-methylphenyl)-4,4'-(hexafluoroisopropylidene)diphthalimide, tris(3,5-dimethyl-4-cyanatobenzyl)isocyanurate, 2-phenyl-3,3-bis(4-cyanatophenyl)phthalimidine, 2-(4-methylphenyl)-3,3-bis(4-cyanatophenyl)phthalimidine, 2-phenyl-3,3-bis(4-cyanato-3-methylphenyl)phthalimidine, 1-methyl-3,3-bis(4-cyanatophenyl)indolin-2-one, and 2-phenyl-3,3-bis(4-cyanatophenyl)indolin-2-one.

These cyanic acid ester compounds can be used alone or two or more thereof can be appropriately used in combination.

Other specific examples of cyanic acid ester compounds represented by Formula (16) include phenolic resins such as phenol novolac resins and cresol novolac resins (those obtained by reacting phenol, alkyl-substituted phenol or halogen-substituted phenol with a formaldehyde compound such as formalin or paraformaldehyde in an acidic solution by a known method), trisphenol novolac resin (those obtained by reacting hydroxybenzaldehyde and phenol in the presence of an acidic catalyst), fluorene novolac resin (those obtained by reacting a fluorenone compound and 9,9-bis(hydroxyaryl)fluorenes in the presence of an acidic catalyst), phenol aralkyl resins, cresol aralkyl resins, naphthol aralkyl resins and biphenyl aralkyl resins (those obtained by reacting a bishalogenomethyl compound represented by $Ar_4$—$(CH_2Y)_2$ ($Ar_4$ indicates a phenyl group, Y indicates a halogen atom, hereinafter the same applies in this paragraph) and a phenol compound in the presence of an acidic catalyst or without a catalyst, those obtained by reacting a bis(alkoxymethyl) compound represented by $Ar_4$—$(CH_2OR)_2$ (R indicates an alkyl group) and a phenol compound in the presence of an acidic catalyst, or those obtained by reacting a bis(hydroxy methyl) compound represented by $Ar_4$—$(CH_2OH)_2$ and a phenol compound in the presence of an acidic catalyst, or those obtained by polycondensation of an aromatic aldehyde compound, an aralkyl compound and a phenol compound by a known method), phenol-modified xylene formaldehyde resins (those obtained by reacting a xylene formaldehyde resin and a phenol compound in the presence of an acidic catalyst by a known method), modified naphthalene formaldehyde resins (those obtained by reacting a naphthalene formaldehyde resin and a hydroxy-substituted aromatic compound in the presence of an acidic catalyst by a known method), and phenol-modified dicyclopentadiene resins, and phenolic resins having a polynaphthylene ether structure (those obtained by dehydration condensation of a polyvalent hydroxy naphthalene compound having two or more phenolic hydroxy groups in one molecule in the presence of a basic catalyst by a known method), and those cyanated by the same method as above, and prepolymers thereof. These are not particularly limited. These cyanic acid ester compounds can be used alone or two or more thereof can be appropriately used in combination.

A method of producing such a cyanic acid ester compound is not particularly limited, and known methods can be used. Examples of such production methods include methods in which a hydroxy group-containing compound having a desired framework is obtained and synthesized and hydroxy groups are modified by a known technique to be converted into a cyanate. Examples of techniques for converting hydroxy groups into a cyanate include techniques described in Ian Hamerton, "Chemistry and Technology of Cyanate Ester Resins,"

Resin cured objects using these cyanic acid ester compounds have excellent properties such as a glass transition temperature, low thermal expansion, and plating adhesiveness.

In the resin composition according to the present embodiment, a total content of the cyanic acid ester compound is not particularly limited, and is preferably 0.01 to 60 parts by mass with respect to 100 parts by mass of the resin solid component in the resin composition of the present embodiment.

(Phenolic Resin)

As the phenolic resin, generally known resins can be used as long as they are phenolic resins having two or more hydroxyl groups in one molecule. Examples thereof include a bisphenol A type phenolic resin, bisphenol E type phenolic resin, bisphenol F type phenolic resin, bisphenol S type phenolic resin, phenol novolac resin, bisphenol A novolac type phenolic resin, glycidyl ester type phenolic resin, aralkyl novolac type phenolic resin, biphenyl aralkyl type phenolic resin, cresol novolac type phenolic resin, multifunctional phenolic resin, naphthol resin, naphthol novolac resin, multifunctional naphthol resin, anthracene type phenolic resin, naphthalene framework-modified novolac type phenolic resin, phenolaralkyl type phenolic resin, naphthol aralkyl type phenolic resin, dicyclopentadiene type phenolic resin, biphenyl type phenolic resin, alicyclic phenolic resin, polyol type phenolic resin, phosphorus-containing phenolic resin, polymerizable unsaturated hydrocarbon group-containing phenolic resin, and hydroxyl group-containing silicone resins, and the present invention is not particularly limited. These phenolic resins can be used alone or two or more thereof can be appropriately used in combination.

In the resin composition according to the present embodiment, a total content of the phenolic resin is not particularly limited, and is preferably 0.01 to 60 parts by mass with respect to 100 parts by mass of the resin solid component in the resin composition of the present embodiment.

(Epoxy Resin)

The epoxy resin is not particularly limited, and generally known resins can be used. Examples thereof include a bisphenol A type epoxy resin, bisphenol E type epoxy resin, bisphenol F type epoxy resin, bisphenol S type epoxy resin, bisphenol A novolac type epoxy resin, biphenyl type epoxy resin, phenol novolac type epoxy resin, cresol novolac type epoxy resin, xylene novolac type epoxy resin, multifunctional phenol type epoxy resin, naphthalene type epoxy resin, naphthalene framework-modified novolac type epoxy resin, naphthylene ether type epoxy resin, phenolaralkyl type epoxy resin, anthracene type epoxy resin, trifunctional phenol type epoxy resin, tetrafunctional phenol type epoxy resin, triglycidyl isocyanurate, glycidyl ester type epoxy resin, alicyclic epoxy resin, dicyclopentadiene novolac type epoxy resin, biphenyl novolac type epoxy resin, phenolaralkyl novolac type epoxy resin, naphthol aralkyl novolac type epoxy resin, aralkyl novolac type epoxy resin, naphthol aralkyl type epoxy resin, dicyclopentadiene type epoxy resin, polyol type epoxy resin, phosphorus-containing epoxy resin, glycidyl amine, compounds with epoxidized double bonds such as butadiene, compounds obtained by reacting hydroxyl group-containing silicone resins with epichlorohydrin and halides thereof. These epoxy resins can be used alone or two or more thereof can be appropriately used in combination.

In the resin composition according to the present embodiment, a total content of the epoxy resin is not particularly limited, and is preferably 0.01 to 60 parts by mass with respect to 100 parts by mass of the resin solid component in the resin composition of the present embodiment.

(Oxetane Resin)

As the oxetane resin, generally known resins can also be used. Examples thereof include alkyloxetane such as oxetane, 2-methyl oxetane, 2,2-dimethyl oxetane, 3-methyl oxetane, and 3,3-dimethyl oxetane, 3-methyl-3-methoxymethyloxetane, 3,3-di(trifluoromethyl)perfluoxetane, 2-chloromethyloxetane, 3,3-bis(chloromethyl)oxetane, biphenyl type oxetane, OXT-101 (product name, commercially available from Toagosei Co., Ltd.), and OXT-121 (product name, commercially available from Toagosei Co., Ltd.), and the present invention is not particularly limited. These oxetane resins can be used alone or two or more thereof can be appropriately used in combination.

In the resin composition according to the present embodiment, a total content of the oxetane resin is not particularly limited, and is preferably 0.01 to 40 parts by mass with respect to 100 parts by mass of the resin solid component in the resin composition of the present embodiment.

(Benzoxazine Compound)

As the benzoxazine compound, generally known compounds can be used as long as they have two or more dihydrobenzoxazine rings in one molecule. Examples thereof include bisphenol A type benzoxazine BA-BXZ (product name, commercially available from Konishi Chemical Ind Co., Ltd.), bisphenol F type benzoxazine BF-BXZ (product name, commercially available from Konishi Chemical Ind Co., Ltd.), bisphenol S type benzoxazine BS-BXZ (product name, commercially available from Konishi Chemical Ind Co., Ltd.), and phenolphthalein type benzoxazine, and the present invention is not particularly limited. These benzoxazine compounds can be used alone or two or more thereof can be appropriately used in combination.

In the resin composition according to the present embodiment, a total content of benzoxazine compounds is not particularly limited, and is preferably 0.01 to 40 parts by mass with respect to 100 parts by mass of the resin solid component in the resin composition of the present embodiment.

(Carbodiimide Compound)

The carbodiimide compound is not particularly limited and generally known compounds can be used as long as they have one or more carbodiimide groups in at least molecule. Examples thereof include polycarbodiimides such as dicyclohexylcarbodiimide, diisopropylcarbodiimide, dimethylcarbodiimide, diisobutylcarbodiimide, dioctylcarbodiimide, t-butyl isopropyl carbodiimide, diphenyl carbodiimide, di-t-butyl carbodiimide, di-β-naphthylcarbodiimide, N,N'-di-2,6-diisopropylphenylcarbodiimide, 2,6,2',6'-tetraisopropyldiphenylcarbodiimide, cyclic carbodiimide, Carbodilite (registered trademark: commercially available from Nisshinbo Chemical Inc.), and Stabaxol (registered trademark: commercially available from LANXESS Deutschland GmbH). These carbodiimide compounds can be used alone or two or more thereof can be appropriately used in combination.

In the resin composition according to the present embodiment, a total content of the carbodiimide compound is not particularly limited, and is preferably 0.01 to 40 parts by mass with respect to 100 parts by mass of the resin solid component in the resin composition of the present embodiment.

(Compound having Ethylenically Unsaturated Group)

The compound having an ethylenically unsaturated group is not particularly limited, and generally known compounds can be used as long as they are compounds having one or more ethylenically unsaturated groups in one molecule. Examples thereof include compounds having a (meth)acryloyl group, a vinyl group and the like.

Examples of compounds having a (meth)acryloyl group include methyl(meth)acrylate, ethyl(meth)acrylate, butyl (meth)acrylate, lauryl(meth)acrylate, polyethylene glycol (meth)acrylate, polyethylene glycol(meth)acrylate monomethyl ether, phenylethyl(meth)acrylate, isobornyl(meth) acrylate, cyclohexyl(meth)acrylate, benzyl(meth)acrylate, tetrahydrofurfuryl(meth)acrylate, butanediol di(meth)acrylate, hexanediol di(meth)acrylate, neopentyl glycol di(meth) acrylate, nonanediol di(meth)acrylate, glycol di(meth)acrylate, diethylene di(meth)acrylate, polyethylene glycol di(meth)acrylate, tris(meth)acryloyloxyethyl isocyanurate, polypropylene glycol di(meth)acrylate, adipate epoxy di(meth)acrylate, bisphenol ethylene oxide di(meth)acrylate, hydrogenated bisphenol ethylene oxide (meth)acrylate, bisphenol di(meth)acrylate, ε-caprolactone-modified hydroxy pivalic acid neopentine glycol di(meth)acrylate, ε-caprolactone-modified dipentaerythritol hexa(meth)acrylate, ε-caprolactone-modified dipentaerythritol poly(meth) acrylate, dipentaerythritol poly(meth)acrylate, trimethylolpropane tri(meth)acrylate, triethylolpropane tri(meth) acrylate, and ethylene oxide adducts thereof; pentaerythritol tri(meth)acrylate, and ethylene oxide adducts thereof; pentaerythritol tetra(meth)acrylate, dipentaerythritol hexa(meth)acrylate, and ethylene oxide adducts thereof.

In addition to these, urethane (meth)acrylates having both a (meth)acryloyl group and a urethane bond in the same molecule; polyester (meth)acrylates having both a (meth) acryloyl group and an ester bond in the same molecule; epoxy (meth)acrylates derived from an epoxy resin and having a (meth)acryloyl group; and reactive oligomers in which these bonds are combined may be exemplified.

Examples of urethane (meth)acrylates include reaction products of a hydroxyl group-containing (meth)acrylate, a polyisocyanate, and other alcohols used as necessary. Examples thereof include hydroxyalkyl(meth)acrylates such as hydroxyethyl(meth)acrylate, hydroxypropyl(meth)acrylate, and hydroxybutyl(meth)acrylate; glycerin (meth)acrylates such as glycerin mono(meth)acrylate and glycerin di(meth)acrylate; and urethane (meth)acrylates obtained by reacting sugar alcohol (meth)acrylates such as pentaerythritol di(meth)acrylate, pentaerythritol tri(meth)acrylate, dipentaerythritol penta(meth)acrylate, and dipentaerythritol hexa(meth)acrylate with polyisocyanates such as toluene diisocyanate, hexamethylene diisocyanate, trimethylhexamethylene diisocyanate, isophorone diisocyanate, norbornene diisocyanate, xylene diisocyanate, hydrogenated xylene diisocyanate, dicyclohexanemethylene diisocyanate, and isocyanurates thereof, and burette reaction products.

Examples of polyester (meth)acrylates include monofunctional (poly)ester(meth)acrylates such as caprolactone-modified 2-hydroxyethyl(meth)acrylate, ethylene oxide and/ or propylene oxide-modified phthalic acid (meth)acrylate, ethylene oxide-modified succinic acid (meth)acrylate, and caprolactone-modified tetrahydrofurfuryl(meth)acrylate; di(poly)ester (meth)acrylates such as hydroxypivalic acid ester neopentyl glycol di(meth)acrylate, caprolactone-modified hydroxypivalic acid ester neopentyl glycol di(meth) acrylate, and epichlorohydrin-modified phthalate di(meth) acrylate; and triol mono-, di- or tri(meth)acrylates obtained by adding 1 mol or more of a cyclic lactone compound such as ε-caprolactone, γ-butyrolactone, and δ-valerolactone to 1 mol of trimethylolpropane or glycerin.

Examples thereof include triol mono-, di-, tri- or tetra (meth)acrylates obtained by adding 1 mol or more of a cyclic lactone compound such as ε-caprolactone, γ-butyrolactone, and δ-valerolactone to 1 mol of pentaerythritol, dimethylolpropane, trimethylolpropane, or tetramethylolpropane, triol mono or poly(meth)acrylate triols obtained by adding 1 mol or more of a cyclic lactone compound such as ε-caprolactone, γ-butyrolactone, and δ-valerolactone to 1 mol of dipentaerythritol, and mono(meth)acrylates or poly(meth) acrylates of polyhydric alcohols such as tetraol, pentaol or hexaol.

In addition, examples thereof include (meth)acrylates of polyester polyols which are reaction products of diol components such as (poly)ethylene glycol, (poly)propylene glycol, (poly)tetramethylene glycol, (poly)butylene glycol, 3-methyl-1,5-pentanediol, and hexanediol and polyacids such as maleic acid, fumaric acid, succinic acid, adipic acid, phthalic acid, isophthalic acid, hexahydrophthalic acid, tetrahydrophthalic acid, dimer acid, sebacic acid, azelaic acid, and 5-sulfoisophthalic acid sodium and anhydrides thereof; and polyfunctional (poly)ester (meth)acrylates such as (meth)acrylates of cyclic lactone-modified polyester diols including the diol components, polyacids and anhydrides thereof, ε-caprolactone, γ-butyrolactone, δ-valerolactone and the like.

Epoxy (meth)acrylates are carboxylate compounds of a compound having an epoxy group and (meth)acrylic acid. Examples thereof include phenol novolac type epoxy (meth) acrylate, cresol novolac type epoxy (meth)acrylate, trishydroxyphenylmethane type epoxy (meth)acrylate, dicyclopentadiene phenol type epoxy (meth)acrylate, bisphenol A type epoxy (meth)acrylate, bisphenol F type epoxy (meth) acrylate, biphenol type epoxy (meth)acrylate, bisphenol A novolac type epoxy (meth)acrylate, naphthalene framework-containing epoxy (meth)acrylate, glyoxal type epoxy (meth) acrylate, heterocyclicepoxy (meth)acrylate, and acid anhydride-modified epoxy acrylates thereof.

Examples of compounds having a vinyl group include vinyl ethers such as ethyl vinyl ether, propyl vinyl ether, hydroxyethyl vinyl ether, and ethylene glycol divinyl ether. Examples of styrenes include styrene, methylstyrene, ethylstyrene, and divinylbenzene. Examples of other vinyl compounds include triallyl isocyanurate, trimethallyl isocyanurate, and bisallylnadimide.

These compounds having an ethylenically unsaturated group can be used alone or two or more thereof can be appropriately used in combination.

In the resin composition according to the present embodiment, a total content of the compound having an ethylenically unsaturated group is not particularly limited, and is preferably 0.01 to 40 parts by mass with respect to 100 parts by mass of the resin solid component in the resin composition of the present embodiment.

(Polymerization Initiator (C))

As the polymerization initiator (C), a thermal radical polymerization initiator is preferable, and an organic peracid-based or azo-based compound used in the related art can be appropriately used.

Examples of organic peracid-based polymerization initiators include methyl ethyl ketone peroxide, methylcyclohexanone peroxide, methyl acetoacetate peroxide, acetyl acetone peroxide, 1,1-bis(t-butylperoxy)3,3,5-trimethylcyclohexane, 1,1-bis(t-hexylperoxy)cyclohexane, 1,1-bis(t-hexylperoxy)3,3,5-trimethylcyclohexane, 1,1-bis(t-butylperoxy)cyclohexane, 2,2-bis(4,4-di-t-butylperoxycyclohexyl) propane, 1,1-bis(t-butylperoxy)cyclododecane, n-butyl 4,4-bis(t-butylperoxy)valerate, 2,2-bis(t-butylperoxy)butane, 1,1-bis(t-butylperoxy)-2-methylcyclohexane, t-butyl hydroperoxide, p-menthane hydroperoxide, 1,1,3,3-tetramethylbutylhydroperoxide, t-hexylhydroperoxide, dicumyl peroxide, 2,5-dimethyl-2,5-bis(t-butylperoxy)hexane, α,α'-bis(t-butylperoxy)diisopropylbenzene, t-butylcumyl peroxide, di-t-butyl peroxide, 2,5-dimethyl-2,5-bis(t-butylperoxy) hexyne-3, isobutyryl peroxide, 3,5,5-trimethylhexanoyl peroxide, octanoyl peroxide, lauroyl peroxide, cinnamic acid peroxide, m-toluoyl peroxide, benzoyl peroxide, diisopropyl peroxydicarbonate, bis(4-t-butylcyclohexyl)peroxydicarbonate, di-3-methoxybutylperoxydicarbonate, di-2- ethylhexyl peroxydicarbonate, di-sec-butyl peroxydicarbonate, di(3-methyl-3-methoxybutyl)peroxydicarbonate, di(4-t-butylcyclohexyl)peroxydicarbonate, α,α'-bis(neodecanoylperoxy)diisopropylbenzene, cumyl peroxyneodecanoate, 1,1,3,3, -tetramethyl butyl peroxyneodecanoate, 1-cyclohexyl-1-methyl ethyl peroxyneodecanoate, t-hexyl peroxyneodecanoate, t-butyl peroxyneodecanoate, t-hexyl peroxypivalate, t-butyl peroxypivalate, 2,5-dimethyl-2,5-bis(2-ethylhexanoylperoxy)hexane, 1,1,3,3-tetramethylbutylperoxy-2-ethylhexanoate, 1-cyclohexyl-1-methyl ethyl peroxy-2-ethylhexanoate, t-hexylperoxy-2-ethylhexanoate, t-butylperoxy-2-ethylhexanoate, t-butyl peroxyisobutyrate, t-butyl peroxymaleic acid, t-butyl peroxylaurate, t-butyl peroxy-3,5,5-trimethylhexanoate, t-butyl peroxy isopropyl monocarbonate, t-butyl peroxy-2-ethylhexyl monocarbonate, 2,5-dimethyl-2,5-bis(benzoylperoxy)hexane, t-butylperoxyacetate,t-hexyl peroxybenzoate, t-butyl peroxy-m-toluoyl benzoate, t-butyl peroxybenzoate, bis(t-butylperoxy)isophthalate, t-butylperoxyallyl monocarbonate, and 3,3',4,4'-tetra(t-butylperoxycarbonyl)benzophenone.

In addition, examples of azo polymerization initiators include 2-phenylazo-4-methoxy-2,4-dimethylvaleronitrile, 1-[(1-cyano-1-methylethyl)azo]formamide, 1,1'-azobis(cyclohexane-1-carbonitrile), 2,2'-azobis(2-methylbutyronitrile), 2,2'-azobisisobutyronitrile, 2,2'-azobis(2,4-dimethylvaleronitrile), 2,2'-azobis(2-methylpropionamidine) dihydrochloride, 2,2'-azobis(2-methyl-N-phenylpropionamidine) dihydrochloride, 2,2'-azobis[N-(4-chlorophenyl)-2-methylpropionamidine]dihydrochloride, 2,2'-azobis[N-(4-hydrophenyl)-2-methylpropionamidine]dihydrochloride, 2,2'-azobis[2-methyl-N-(phenylmethyl)propionamidine]dihydrochloride, 2,2'-azobis[2-methyl-N-(2-propenyl)propionamidine]dihydrochloride, 2,2'-azobis[N-(2-hydroxyethyl)-2-methylpropionamidine]dihydrochloride, 2,2'-azobis[2-(5-methyl-2-imidazolin-2-yl)propane]dihydrochloride, 2,2'-azobis[2-(2-imidazolin-2-yl)propane]dihydrochloride, 2,2'-azobis[2-(4,5,6,7-tetrahydro-1H-1,3-diazepine-2-yl) propane]dihydrochloride, 2,2'-azobis[2-(3,4,5,6-tetrahydropyrimidin-2-yl)propane]dihydrochloride, 2,2'-azobis[2-(5-hydroxy-3,4,5,6-tetrahydropyrimidin-2-yl) propane]dihydrochloride, 2,2'-azobis[2-(5-hydroxy-3,4,5,6-tetrahydropyrimidin-2-yl)propane] dihydrochloride, 2,2'-azobis[2-[1-(2-hydroxyethyl)-2-imidazolin-2-yl]propane] dihydrochloride, 2,2'-azobis[2-(2-imidazolin-2-yl)propane], 2,2'-azobis[2-methyl-N-[1,1-bis(hydroxymethyl)-2-hydroxyethyl]propionamide], 2,2'-azobis[2-methyl-N-[1,1-bis(hydroxymethyl)ethyl]propionamide], 2,2'-azobis[2-methyl-N-(2-hydroxyethyl)propionamide], 2,2'-azobis(2-methylpropionamide), 2,2'-azobis(2,4,4-trimethylpentane), 2,2'-azobis(2-methylpropane), dimethyl-2,2-azobis(2-methylpropionate), 4,4'-azobis(4-cyanopentanoic acid), and 2,2'-azobis[2-(hydroxymethyl)propionitrile].

The thermal polymerization initiators can be used alone or two or more thereof can be used in combination.

The content of the polymerization initiator (C) is not particularly limited, and is preferably 0.1 to 10 parts by mass and more preferably 0.5 to 5 parts by mass with respect to a total amount of 100 parts by mass of the bismaleimide compound (A) and the compound (B).

(Curing Accelerator (D))

The curing accelerator (D) is not particularly limited, and examples thereof include phosphine compounds, compounds containing a phosphonium salt, and imidazole compounds, and these may be used alone or two or more thereof can be used in combination. Among these, the imidazole compound is preferable. Since the imidazole compound has a particularly excellent function as a catalyst, it can more reliably promote the polymerization reaction of the bismaleimide compound (A).

The imidazole compound is not particularly limited, and examples thereof include 2-ethyl-4-methylimidazole, 2-methylimidazole, 2-ethylimidazole, 2,4-dimethylimidazole, 2-undecylimidazole, 2-heptadecylimidazole, 2-phenylimidazole, 2-phenyl-4-methylimidazole, 1-benzyl-2-methylimidazole, 2-phenyl-4,5-dihydroxymethylimidazole, 2-phenyl-4-methyl-5-hydroxymethylimidazole, 1-vinyl-2-methylimidazole, 1-propyl-2-methylimidazole, 2-isopropylimidazole, 1-cyanomethyl-2-methyl-imidazole, 1-cyanoethyl-2-ethyl-4-methylimidazole, 1-cyanoethyl-2-undecylimidazole, and 1-cyanoethyl-2-phenylimidazole. Among these, 2-methylimidazole, 2-phenylimidazole, 2-undecylimidazole, and 2-ethyl-4-methylimidazole are preferable. When these compounds are used, advantages of further promoting the reaction of the bismaleimide compound (A) and the thermally curable resin or the compound (B) and improving the heat resistance of the obtained cured object are obtained. These can be used alone or two or more thereof can be used in combination.

The phosphine compound is not particularly limited, and examples thereof include primary phosphines such as alkylphosphines, for example, ethylphosphine and propylphosphine, and phenylphosphine; secondary phosphines such as dialkylphosphines, for example, dimethylphosphine and diethylphosphine, and diphenylphosphine, methylphenylphosphine, and ethylphenylphosphine; and tertiary phosphines such as trialkylphosphines, for example, trimethylphosphine, triethylphosphine, tributylphosphine, and trioctylphosphine, and tricyclohexylphosphine, triphenylphosphine, alkyldiphenylphosphine, dialkylphenylphosphine, tribenzylphosphine, tritolylphosphine, tri-p-styrylphosphine, tris(2,6-dimethoxyphenyl)phosphine, tri-4-methylphenylphosphine, tri-4-methoxyphenylphosphine, and tri-2-cy anoethylphosphine. Among these, tertiary phosphines are preferably used. These can be used alone or two or more thereof can be used in combination.

Examples of compounds containing a phosphonium salt include compounds containing a tetraphenyl phosphonium salt, an alkyltriphenyl phosphonium salt, a tetraalkylphosphonium and the like, and more specific examples thereof include tetraphenylphosphonium-thiocyanate, tetraphenylphosphonium-tetra-p-methylphenylborate, butyltriphenylphosphonium-thiocyanate, tetraphenylphosphonium-phthalic acid, and tetrabutylphosphonium-1,2-cyclohexyldicarboxylic acid.

The content of the curing accelerator (D) is not particularly limited, and is preferably to 10 parts by mass and more preferably 0.5 to 5 parts by mass with respect to a total amount of 100 parts by mass of the bismaleimide compound (A) and the thermally curable resin or the compound (B).

The thermally curable resin composition of the present embodiment may contain any one or both of the polymerization initiator (C) and the curing accelerator (D). When both the polymerization initiator (C) and the curing accelerator (D) are included, a total content thereof is preferably 0.1 to 10 parts by mass and more preferably 0.5 to 5 parts by mass with respect to a total amount of 100 parts by mass of the bismaleimide compound (A) and the thermally curable resin or the compound (B).

The thermally curable resin composition of the present embodiment may contain, as a component (E) other than essential components, for example, an inorganic filling material, a mold release agent, a flame retardant, an ion trapping agent, an antioxidant, an adhesion imparting agent, a low stress agent, a coloring agent, and a coupling agent as long as the effects of the present invention are not impaired.

(Filling Material)

The resin composition of the present embodiment may further contain a filling material in order to improve various properties such as coating properties and heat resistance. As the filling material, a material that has insulation and does not inhibit transmittance at a wavelength of 405 nm (h line) is preferable. The filling material is not particularly limited, and examples thereof include silica (for example, natural silica, fused silica, amorphous silica, hollow silica, etc.), aluminum compounds (for example, boehmite, aluminum hydroxide, alumina, aluminum nitride, etc.), boron compounds (for example, boron nitride, etc.), magnesium compounds (for example, magnesium oxide, magnesium hydroxide, etc.), calcium compounds (for example, calcium carbonate, etc.), molybdenum compounds (for example, molybdenum oxide, zinc molybdate, etc.), barium compounds (for example, barium sulfate, barium silicate, etc.), talc (for example, natural talc, calcined talc, etc.), mica, glass (for example, short fiber glass, spherical glass, fine powder glass (for example, E glass, T glass, D glass, etc.), etc.), silicone powder, fluororesin-based filling materials, urethane resin-based filling materials, (meth)acrylic resin-based filling materials, polyethylene-based filling materials, styrene-butadiene rubber, and silicone rubber. These filling materials can be used alone or two or more thereof can be appropriately used in combination.

Among these, at least one selected from the group consisting of silica, boehmite, barium sulfate, silicone powder, fluororesin-based filling materials, urethane resin-based filling materials, (meth)acrylic resin-based filling materials, polyethylene-based filling materials, styrene-butadiene rubber, and silicone rubber is preferable.

These filling materials may be surface-treated with a silane coupling agent to be described below or the like.

Silica is preferable and fused silica is more preferable because the heat resistance of the cured object obtained by curing the resin composition of the present embodiment is improved and favorable coating properties are obtained. Specific examples of silica include SFP-130MC and the like (commercially available from Denka Co., Ltd.), SC2050-MB, SC1050-MLE, YA010C-MFN, YA050C-MJA, and the like (commercially available from Admatechs).

The particle size of the filling material is not particularly limited, and generally 0.005 to 100 μm, and preferably 0.01 to 50 μm.

In the resin composition of the present embodiment, the content of the filling material is not particularly limited, and is preferably 1,000 parts by mass or less, more preferably 500 parts by mass or less, and most preferably 300 parts by mass or less with respect to 100 parts by mass of the resin solid component in the resin composition because the heat resistance of the cured object is improved. Here, when the filling material is contained, the lower limit value is not particularly limited, and is generally 1 part by mass with respect to 100 parts by mass of the resin solid component in the resin composition because an effect of improving various properties such as coating properties and heat resistance is obtained.

<Silane Coupling Agent and Wetting and Dispersing Agent>

In the resin composition of the present embodiment, in order to improve dispersibility of the filling material, and the adhesive strength between the polymer and/or the resin and the filling material, a silane coupling agent and/or a wetting and dispersing agent can be used in combination.

These silane coupling agents are not particularly limited as long as they are silane coupling agents that are generally used for a surface treatment of inorganic substances. Specific examples include aminosilane-agents such as 3-aminopropyltrimethoxysilane, 3-aminopropyltriethoxysilane, 3-aminopropyldimethoxymethylsilane, 3-aminopropyldiethoxymethylsilane, N-(2-aminoethyl)-3-aminopropyltrimethoxysilane, N-(2-aminoethyl)-3-aminopropyltriethoxysilane, N-(2-aminoethyl)-3-aminopropyldimethoxymethylsilane, N-(2-aminoethyl)-3-aminopropyldiethoxymethylsilane, N-phenyl-3-aminopropyltrimethoxysilane, N-phenyl-3-aminopropyltriethoxysilane, [3-(6-aminohexylamino)propyl]trimethoxysilane, and [3-(N,N-dimethylamino)propyl]trimethoxysilane; epoxy silane-based agents such as 3-glycidoxypropyltrimethoxysilane, 3-glycidoxypropyltriethoxysilane, 3-glycidoxypropyldimethoxymethylsilane, 3-glycidoxypropyldiethoxymethylsilane, 2-(3,4-epoxycyclohexyl)ethyltrimethoxysilane, and [8-(glycidyloxy)-n-octyl]trimethoxysilane; vinyl silane-based agents such as vinyl tris(2-methoxyethoxy)silane, vinyltrimethoxysilane, vinyltriethoxysilane, dimethoxymethylvinylsilane, diethoxy methyl vinylsilane, trimethoxy(7-octen-1-yl)silane, and trimethoxy(4-vinylphenyl)silane; methacrylsilane-based agents such as 3-methacryloxypropyltrimethoxysilane, 3-methacryloxypropyltriethoxysilane, 3-methacryloxypropyldimethoxymethylsilane, and 3-methacryloxypropyldiethoxymethylsilane, and acrylic silane-based agents such as 3-acryloxypropyltrimethoxysilane and 3-acryloxypropyltriethoxysilane; isocyanate silane-based agents such as 3-isocyanatopropyltrimethoxysilane and 3-isocyanatopropyltriethoxysilane; isocyanurate silane-based agents such as tris-(trimethoxysilylpropyl)isocyanurate; mercaptosilane-based agents such as 3-mercaptopropyltrimethoxysilane and 3-mercaptopropyldimethoxymethylsilane; ureidosilane-based agents such as 3-ureidopropyltriethoxysilane; styrylsilane-based agents such as p-styryltrimethoxysilane; cationic silane-based agents such as N-[2-(N-vinylbenzylamino)ethyl]-3-aminopropyltrimethoxysilane hydrochloride; acid anhydride-based agents such as [3-(trimethoxysilyl)propyl]succinic anhydride; phenylsilane-based agents such as phenyltrimethoxysilane, phenyltriethoxysilane, dimethoxymethylphenylsilane, diethoxy methylphenylsilane, and p-tolyltrimethoxysilane; and arylsilane-based agents such as trimethoxy(l-naphthyl)silane. These silane coupling agents can be used alone or two or more thereof can be appropriately used in combination.

In the resin composition of the present embodiment, the content of the silane coupling agent is not particularly limited, and is generally, 0.1 to 10 parts by mass with respect to 100 parts by mass of the resin solid component in the resin composition.

The wetting and dispersing agent is not particularly limited as long as it is a dispersion stabilizer used for paints. Specific examples include wetting and dispersing agents such as DISPERBYK (registered trademark)-110, 111, 118, 180, 161, and BYK (registered trademark)-W996, W9010, W903 (which are commercially available from BYK Japan). These wetting and dispersing agents can be used alone or two or more thereof can be appropriately used in combination.

In the resin composition of the present embodiment, the content of the wetting and dispersing agent is not particularly limited, and is generally 0.1 to 10 parts by mass with respect to 100 parts by mass of the resin solid component in the resin composition.

<Organic Solvent>

The resin composition of the present embodiment may contain, as necessary, an organic solvent. When the organic solvent is used, it is possible to adjust the viscosity when the resin composition is prepared. The type of the organic solvent is not particularly limited as long as it can dissolve a part or all of the resin in the resin composition. Specific examples are not particularly limited, and examples thereof include ketones such as acetone, methyl ethyl ketone, and methyl isobutyl ketone; alicyclic ketones such as cyclopentanone and cyclohexanone; cellosolve-based solvents such as propylene glycol monomethyl ether, and propylene glycol monomethyl ether acetate; ester-based solvents such as ethyl lactate, methyl acetate, ethyl acetate, butyl acetate, isoamyl acetate, methyl methoxypropionate, methyl hydroxyisobutyrate, and γ-butyrolactone; polar solvents such as amides, for example, dimethylacetamide and dimethylformamide; and non-polar solvents such as aromatic hydrocarbons, for example, toluene, xylene, and anisole.

These organic solvents can be used alone or two or more thereof can be appropriately used in combination.

<Other Components>

In the resin composition of the present embodiment, as long as properties of the present embodiment are not impaired, various polymer compounds such as thermally curable resin, thermoplastic resins, oligomers thereof, and elastomers not previously mentioned; flame retardant compounds not previously mentioned; additives and the like can be used in combination. These are not particularly limited as long as they are generally used. Examples of flame retardant compounds include nitrogen-containing compounds such as melamine and benzoguanamine, phosphate compounds of phosphorus compounds, aromatic condensed phosphate esters, and halogen-containing condensed phosphate esters. Examples of additives include ultraviolet absorbers, antioxidants, fluorescent brightening agents, photosensitizers, dyes, pigments, thickeners, lubricants, antifoaming agents, surface conditioners, brightening agents, polymerization inhibitors, and curing accelerators. These components can be used alone or two or more thereof can be appropriately used in combination.

In the resin composition of the present embodiment, the content of other components is not particularly limited, and is generally 0.1 to 10 parts by mass with respect to 100 parts by mass of the resin solid component in the resin composition.

<Method of Producing Resin Composition>

The resin composition of the present embodiment is prepared by appropriately mixing the maleimide compound of the present embodiment, and as necessary, a resin or compound, a photocuring initiator, a filling material, other components, additives and the like. The resin composition of the present embodiment can be suitably used as a varnish when a resin sheet of the present embodiment to be described below is prepared.

A method of producing a resin composition of the present embodiment is not particularly limited, and for example, a method of sequentially blending the above components with a solvent and performing stirring sufficiently may be exemplified.

During production of the resin composition, as necessary, known treatments (stirring, mixing, and kneading treatments, etc.) for uniformly dissolving or dispersing components can be performed. Specifically, when stirring and dispersing treatments are performed using a stirring tank with a stirrer having an appropriate stirring ability, it is possible to improve the dispersibility of the filling material in the resin composition. The stirring, mixing, and kneading treatments can be appropriately performed using known devices, for example, stirring devices for dispersion such as an ultrasonic homogenizer, devices for mixing such as three rollers, ball mills, bead mills, and sand mills or revolution or rotation mixing devices. In addition, when the resin composition of the present embodiment is prepared, an organic solvent can be used as necessary. The type of the organic solvent is not particularly limited as long as it can dissolve the resin in the resin composition, and specific examples thereof are as described above.

<Applications>

The resin composition of the present embodiment can be used for applications for which an insulating resin composition is required, and the present invention is not particularly limited, and the resin composition can be used for applications such as photosensitive films, photosensitive films with a support, prepregs, resin sheets, circuit substrates (laminate applications, multilayered printed wiring board applications, etc.), solder resists, underfill materials, die bonding materials, semiconductor encapsulation materials, hole-filling resins, part-embedding resins, and fiber-reinforced composite materials. Among these, the resin composition of the present embodiment can be suitably used as an insulating layer for a multilayered printed wiring board or for a solder resist because it has better adhesiveness to chips, substrates and the like and has excellent heat resistance and thermal stability.

[Cured Object]

A cured object of the present embodiment is obtained by curing the resin composition of the present embodiment. Although it is not particularly limited, for example, a cured object can be obtained by melting a resin composition or dissolving a resin composition in a solvent, then pouring it into a mold, and curing it under general conditions using heat, light or the like. In the case of heat curing, the curing temperature is not particularly limited, and is preferably in a range of 120° C. to 300° C. in order to proceed curing efficiently and prevent deterioration of the obtained cured object. In the case of photocuring, a light wavelength range is not particularly limited, and curing is preferably performed in a range of 100 nm to 500 nm in which curing proceeds more efficiently using a photopolymerization initiator or the like.

[Resin Sheet]

A resin sheet of the present embodiment is a resin sheet with a support including a support and a resin layer that is disposed on one surface or both surfaces of the support, and the resin layer contains the resin composition of the present embodiment. A resin sheet can be produced by applying a resin composition onto a support and drying it. The resin layer in the resin sheet of the present embodiment has excellent adhesiveness to chips, substrates and the like and also has excellent heat resistance and thermal stability.

Known supports can be used, and supports are not particularly limited, and a resin film is preferable. Examples of resin films include a polyimide film, polyamide film, polyester film, polyethylene terephthalate (PET) film, polybutylene terephthalate (PBT) film, polypropylene (PP) film, polyethylene (PE) film, polyethylene naphthalate film, polyvinyl alcohol film, and triacetyl acetate film. Among these, a PET film is preferable.

In order to facilitate peeling off from the resin layer, a resin film to which a release agent is applied to the surface can be suitably used. The thickness of the resin film is preferably in a range of 5 to 100 μm and more preferably in a range of 10 to 50 μm. If the thickness is less than 5 μm, the support tends to break when the support is peeled off, and if the thickness is more than 100 μm, the resolution when exposed from above the support tends to decrease.

In addition, in order to reduce scattering of light during exposure, it is preferable that the resin film have excellent transparency.

In addition, in the resin sheet of the present embodiment, the resin layer may be protected with a protective film.

When the side of the resin layer is protected with a protective film, it is possible to prevent dust from adhering to or scratching the surface of the resin layer. As the protective film, a film made of the same material as the resin film can be used. The thickness of the protective film is not particularly limited, and is preferably in a range of 1 to 50 μm and more preferably in a range of 5 to 40 μm. If the thickness is less than 1 μm, handling properties of the protective film tend to deteriorate, and if the thickness is more than 50 μm, the cost tends to increase. Here, for the protective film, it is preferable that the adhesive strength between the resin layer and the protective film be smaller than the adhesive strength between the resin layer and the support.

A method of producing a resin sheet of the present embodiment is not particularly limited, and examples thereof include a method of producing a resin sheet by applying the resin composition of the present embodiment to a support such as a PET film, drying it, and removing an organic solvent.

Coating can be performed by known methods using, for example, a roll coater, a comma coater, a gravure coater, a die coater, a bar coater, a lip coater, a knife coater, a squeeze coater or the like. Drying can be performed, for example, by a method of heating in a dryer at 60 to 200° C. for 1 to 60 minutes.

The amount of the organic solvent remaining in the resin layer is preferably 5 mass % or less with respect to a total mass of the resin layer in order to prevent diffusion of the organic solvent in subsequent processes. The thickness of the resin layer is preferably 1 to 50 μm in order to improve handling properties.

The resin sheet of the present embodiment can be used for producing the insulating layer of the multilayered printed wiring board.

[Prepreg]

A prepreg of the present embodiment includes a substrate and a resin composition that is impregnated into or applied to the substrate. A method of producing the prepreg of the present embodiment is not particularly limited as long as it is a method of producing a prepreg by combining the resin composition of the present embodiment and a substrate. For example, the resin composition of the present embodiment is impregnated into or applied to the substrate, and then semi-cured (B-staged) by a method of performing drying in a dryer at 120 to 220° C. for about 2 to 15 minutes, and thus the prepreg of the present embodiment can be produced. In this case, the amount of the resin composition adhered to the substrate, that is, the content (including the filling material) of the resin composition with respect to 100 parts by mass of the prepreg after semi-curing is preferably in a range of 20 to 99 parts by mass.

As the substrate used when the prepreg of the present embodiment is produced, known substrates used in various printed wiring board materials can be used. The substrate is not particularly limited, and examples thereof include inorganic fibers other than glass such as glass fibers and quartz; organic fibers such as polyimide, polyamide, and polyester; and woven fabrics such as liquid crystal polyester. As the shape of the substrate, woven fabrics, non-woven fabrics, rovings, chopped strand mats, surfacing mats and the like are known, and any of these may be used. The substrates can be used alone or two or more thereof can be used in combination. Among woven fabrics, particularly, woven fabrics subjected to a super-opening treatment and a stuffing treatment are suitable in consideration of dimensional stability. A liquid crystal polyester woven fabric is preferable in consideration of electrical characteristics. The thickness of the substrate is not particularly limited and is preferably in a range of 0.01 to 0.2 mm for laminate applications.

[Metal-Clad Laminate]

A metal-clad laminate of the present embodiment includes a layer containing at least one selected from the group consisting of the resin sheet of the present embodiment and the prepreg of the present embodiment, and a metal foil that is provided on one surface or both surfaces of the layer, and the layer contains a cured object of the resin composition according to the present embodiment. When the prepreg is used, for example, a metal-clad laminate can be prepared by arranging a metal foil such as copper or aluminum on one surface or both surfaces of one prepreg or a lamination of a plurality of prepregs and performing laminating and molding. The metal foil used here is not particularly limited as long as it is used for printed wiring board materials, but copper foils such as rolled copper foils and electrolytic copper foils are preferable.

The thickness of the metal foil is not particularly limited, and is preferably 2 to 70 μm and more preferably 3 to 35 μm. Regarding molding conditions, a technique used in preparation of general printed wiring board laminates and multi-layer boards can be used. For example, a metal-clad laminate of the present embodiment can be produced using a multi-stage press machine, a multi-stage vacuum press machine, a continuous molding machine, an autoclave molding machine or the like to perform laminating and molding under conditions of a temperature of 180 to 350° C., a heating time of 100 to 300 minutes, and a surface pressure of 20 to 100 kg/cm². In addition, a multi-layer board can be prepared by combining the prepreg and an inner layer wiring board separately prepared and performing laminating and molding. As a method of producing a multi-layer board, for example, a 35 μm copper foil is arranged on both surfaces of one prepreg, and laminated and molded under the above conditions, an inner layer circuit is then formed, and this circuit is subjected to a blacking treatment to form an inner layer circuit board. In addition, the inner layer circuit board and the prepreg are alternately arranged one by one, a copper foil is additionally arranged on the outermost layer, and laminating and molding are performed under the above conditions, preferably under vacuum. Thereby, a multi-layer board can be prepared.

The metal-clad laminate of the present embodiment can be suitably used as a printed wiring board by additional pattern formation. The printed wiring board can be produced according to a general method, and the production method is not particularly limited. Hereinafter, an example of a method of producing a printed wiring board will be exemplified.

First, the metal-clad laminate is prepared. Next, an inner layer substrate is prepared by etching the surface of the metal-clad laminate and forming an inner layer circuit. The surface of the inner layer circuit of the inner layer substrate is subjected to a surface treatment, as necessary, in order to increase the adhesive strength, and a required number of prepregs are then laminated on the surface of the inner layer circuit. In addition, a metal foil for an outer layer circuit is laminated on the outer side thereof, and integrally molded by heating and pressing. In this manner, a multi-layer laminate in which a substrate and an insulating layer composed of a cured object of a thermally curable resin composition are formed is produced between the inner layer circuit and the metal foil for the outer layer circuit. Next, this multi-layer laminate is subjected to drilling processing for through-holes and via-holes, and a plating metal film that causes the inner layer circuit and the metal foil for the outer layer circuit to be electrically continuous is then formed on the wall of the hole. In addition, a printed wiring board is produced by etching the metal foil for the outer layer circuit to form the outer layer circuit.

The printed wiring board obtained in the above production example has an insulating layer and a conductor layer formed on one surface or both surfaces of the insulating layer, and the insulating layer contains the resin composition of the present embodiment. For example, the prepreg of the present embodiment (the substrate and the resin composition of the present embodiment impregnated into or applied to the substrate), and the layer of the resin composition of the metal-clad laminate of the present embodiment (the layer made of the resin composition of the present embodiment) can constitute the insulating layer containing the resin composition of the present embodiment.

[Multilayered Printed Wiring Board]

The multilayered printed wiring board of the present embodiment has an insulating layer and a conductor layer that is formed on one surface or both surfaces of the insulating layer, and the insulating layer contains the resin composition of the present embodiment. The insulating layer can be obtained, for example, by laminating one or more resin sheets and curing them. The prepreg of the present embodiment may be used in place of the resin sheet of the present embodiment. The multilayered printed wiring board of the present embodiment can be produced according to a general method, and the production method is not particularly limited. Hereinafter, an example of a method of producing a multilayered printed wiring board will be exemplified.

First, the metal-clad laminate is prepared. Next, an inner layer substrate is prepared by etching the surface of the metal-clad laminate to form an inner layer circuit. The surface of the inner layer circuit of the inner layer substrate is subjected to a surface treatment, as necessary, in order to increase the adhesive strength, and a required number of prepregs are then laminated on the surface of the inner layer circuit. In addition, a metal foil for an outer layer circuit is laminated on the outer side thereof, and integrally molded by heating and pressing. In this manner, a multi-layer laminate in which a substrate and an insulating layer composed of a cured object of a resin composition are formed is produced between the inner layer circuit and the metal foil for the outer layer circuit. Next, this multi-layer laminate is subjected to drilling processing for through-holes and via-holes, and a plating metal film that causes the inner layer circuit and the metal foil for the outer layer circuit to be electrically continuous is then formed on the wall of the hole. In addition, a multilayered printed wiring board is produced by etching the metal foil for the outer layer circuit to form the outer layer circuit.

The printed wiring board obtained in the production example has an insulating layer and a conductor layer formed on one surface or both surfaces of the insulating layer, and the insulating layer contains the resin composition of the present embodiment. For example, the prepreg of the present embodiment (the substrate and the resin composition of the present embodiment impregnated into or applied to the substrate), and the layer of the resin composition of the metal-clad laminate of the present embodiment (the layer made of the resin composition of the present embodiment) can constitute the insulating layer containing the resin composition of the present embodiment.

[Sealing Material]

The sealing material of the present embodiment contains the resin composition of the present embodiment. A method of producing a sealing material is not particularly limited, and generally known methods can be appropriately applied. For example, a sealing material can be produced by mixing the resin composition of the present embodiment, various known additives or solvents that are generally used for sealing material applications, and the like using a known mixer. Here, during mixing, a method of adding the maleimide compound of the present embodiment, various additives, and a solvent is not particularly limited, and generally known methods can be appropriately applied.

[Fiber-Reinforced Composite Material]

The fiber-reinforced composite material of the present embodiment includes the resin composition of the present embodiment and reinforcing fibers. As the reinforcing fibers, generally known fibers can be used and the present invention is not particularly limited. Examples thereof include glass fibers such as E glass, D glass, L glass, S glass, T glass, Q glass, UN glass, NE glass, and spherical glass; carbon fibers; aramid fibers; boron fibers; PBO fibers; high-strength polyethylene fibers; alumina fibers; and silicon carbide fibers. The form and arrangement of reinforcing fibers are not particularly limited, and can be appropriately selected from among woven fabrics, non-woven fabrics, mats, knits, braids, unidirectional strands, rovings, chopped and the like. In addition, preforms (those obtained by laminating woven fabrics made of reinforcing fibers, those obtained by stitching and integrating them with stitch threads, or fiber structures such as three-dimensional woven fabrics and braids) as forms of reinforcing fibers can be applied.

A method of producing such a fiber-reinforced composite material is not particularly limited and generally known methods can be appropriately applied. Examples thereof include a liquidcompositemolding method, a resinfilminfusion method, a filamentwinding method, a handlay-up method, and a pultrusion method. Among these, the resintransfermolding method, which is one liquidcompositemolding method, can be used for various applications because materials other than preforms such as metal plates, foam cores, and honeycomb cores can be set in advance in the mold, and is preferably used when composite materials with relatively complex shapes are mass-produced in a short time.

[Adhesive]

An adhesive of the present embodiment contains the resin composition of the present embodiment. A method of producing an adhesive is not particularly limited, and generally known methods can be appropriately applied. For example, an adhesive can be produced by mixing the resin composition of the present embodiment, various known additives generally used in adhesive applications, a solvent and the like using a known mixer. Here, during mixing, a method of adding the maleimide compound of the present embodiment, various additives, and a solvent is not particularly limited, and generally known methods can be appropriately applied.

[Semiconductor Device]

A semiconductor device of the present embodiment contains the resin composition of the present embodiment. Specifically, it can be produced by the following method. A semiconductor device can be produced by mounting a semiconductor chip on a conduction part of the multilayered printed wiring board of the present embodiment. Here, the conduction part is a part of the multilayered printed wiring board that transmits an electronic signal, and the part may be a surface or an embedded part. In addition, the semiconductor chip is not particularly limited as long as it is an electric circuit element made of a semiconductor. The method of mounting a semiconductor chip when the semiconductor device of the present embodiment is produced is not particularly limited as long as the semiconductor chip functions effectively, and specific examples thereof include a wire bonding mounting method, a flip-chip mounting method, a mounting method using a bumpless build-up layer (BBUL), a mounting method using an anisotropic conductive film (ACF) and a mounting method using a non-conductive film (NCF).

In addition, a semiconductor device can be produced by forming an insulating layer containing the resin composition of the present embodiment on a semiconductor chip or a substrate on which a semiconductor chip is mounted. The shape of the substrate on which a semiconductor chip is mounted may be a wafer shape or a panel shape. After formation, the same method as in the multilayered printed wiring board can be used for production.

EXAMPLES

Hereinafter, the present invention will be described in more detail with reference to examples and comparative examples, but the present invention is not limited to the following examples.

Molecular weight measurement conditions are as follows.
model: GPC TOSOH HLC-8220GPC
column: Super HZM-N
eluent: THF (tetrahydrofuran); 0.35 ml/min, 40° C.
detector: RI (differential refractometer)
molecular weight standard: polystyrene
<Synthesis of Bismaleimide Compound (A)>

Synthesis Example 1

100 g of toluene and 33 g of N-methylpyrrolidone were put into a 500 ml round bottom flask with a fluororesin-coated stirring bar. Next, 80.2 g (0.16 mol) of PRIAMINE 1075 (commercially available from Croda Japan) was added and 14.4 g (0.16 mol) of methanesulfonic anhydride was then slowly added to form a salt. Stirring was performed for about 10 minutes for mixing, and 44-(2,5-dioxotetrahydrofuran-3-yl)-1,2,3,4-tetrahydronaphthalene-1,2 dicarboxylic anhydride (22.5 g, 0.08 mol) was then slowly added to the stirred mixture. A Dean-Stark apparatus and a condenser were attached to the flask. The mixture was heated to reflux for 6 hours to form an amine-terminated diimide. The theoretical amount of water produced from this condensation was obtained by this time. The reaction mixture was cooled to room temperature or lower, and 17.6 g (0.19 mol) of maleic anhydride was added to the flask. The mixture was additionally refluxed for 8 hours to obtain an expected amount of produced water. The mixture was cooled to room temperature and 200 ml of toluene was then added to the flask. Next, the diluted organic layer was washed with water (100 ml×3 times) to remove salts and unreacted raw materials. Then, the solvent was removed under vacuum to obtain 104 g of a dark amber liquid bismaleimide compound (a yield of 93%, Mw=3,700) (A-1).

Comparative Synthesis Example 1

110 g of toluene and 36 g of N-methylpyrrolidone were put into a 500 ml round bottom flask with a fluororesin-coated stirring bar. Next, 90.5 g (0.17 mol) of PRIAMINE 1075 (commercially available from Croda Japan) was added and 16.3 g (0.17 mol) of methanesulfonic anhydride was then slowly added to form a salt. Stirring was performed for about 10 minutes for mixing, and 1,2,4,5-cyclohexanetetracarboxylic dianhydride (18.9 g, 0.08 mol) was then slowly added to the stirred mixture. A Dean-Stark apparatus and a condenser were attached to the flask. The mixture was heated to reflux for 6 hours to form an amine-terminated diimide. The theoretical amount of water produced from this condensation was obtained by this time. The reaction mixture was cooled to room temperature or lower, and 19.9 g (0.20 mol) of maleic anhydride was added to the flask. The mixture was additionally refluxed for 8 hours to obtain an expected amount of produced water. The mixture was cooled to room temperature and 200 ml of toluene was then added to the flask. Next, the diluted organic layer was washed with water (100 ml×3 times) to remove salts and unreacted raw materials. Then, the solvent was removed under vacuum to obtain 110 g of an amber wax bismaleimide compound (a yield of 92%, Mw=3,000) (A'-3).

Examples 1 to 3 and Comparative Examples 1 to 3

<Preparation of Thermally Curable Resin Composition and Resin Film>

Components shown below were blended according to compositions shown in Table 1 to prepare thermally curable resin compositions of Example 1 to 3 and Comparative Example 1 to 3. Using an applicator, on a hot plate heated to 60° C., the thermally curable resin composition was applied onto a 12 μm ultra-low-roughness electrolytic copper foil (CF-T4X-S V (product name), commercially available from Fukuda Metal Foil & Powder Co., Ltd.), and heated using an oven at 120° C. for 30 minutes to prepare a B-stage resin film having a thickness of 100 μm. Here, in Table 1, the amounts of the components (A) to (D) are parts by mass. In addition, when the thermally curable resin composition was prepared, the compound obtained in Synthesis Example 1 was used for Examples 1, 2, and 3, and the compound obtained in Comparative Synthesis Example 1 was used for Comparative Example 3.

<Bismaleimide Compound (A)>

(A-1) a bismaleimide compound including a constituent unit represented by General Formula (1) and maleimide groups at both ends of a molecular chain bismaleimide compound A-1 of Synthesis Example 1 (compound represented by the following Formula (3), high-viscosity liquid at 25° C.)

[Chem. 21]

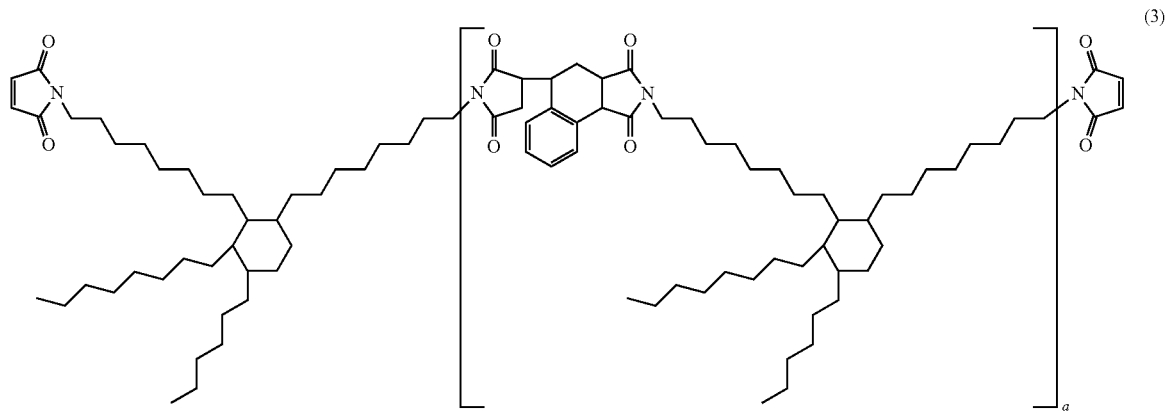

(3)

In Formula (3), a indicates an integer of 1 to 10. a is preferably an integer of 1 to 6 because a more suitable viscosity can be obtained and an increase in viscosity of the varnish can be better controlled.

<Bismaleimide Compound (A') that does not Satisfy General Formula (1)>

(A'-1) BMI-2300 (polyphenylmethane maleimide, compound represented by the following Formula (19), solid at 25° C., commercially available from Daiwa Fine Chemicals Co., Ltd.) (A'-2) BMI-3000 (compound represented by the following Formula (12), solid at 25° C., commercially available from DESIGNER MOLECURES Inc.)

(A'-3) Comparative Synthesis Example 1 (compound represented by the following Formula (20), liquid at 25° C.)

[Chem. 22]

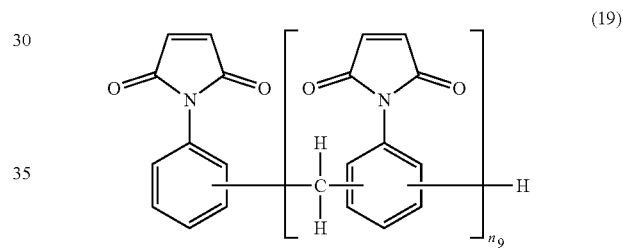

(19)

In Formula (19), a plurality of R1's all indicate a hydrogen atom. $n_9$ indicates an integer of 1 or more, preferably an integer of 1 to 10, and more preferably an integer of 1 to 5.

[Chem. 23]

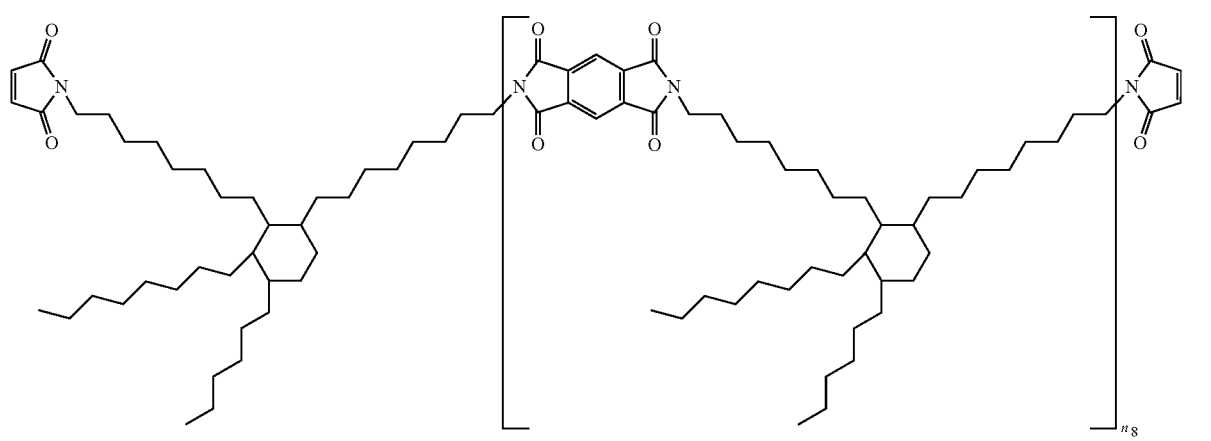

(12)

In Formula (12), $n_8$ indicates an integer of 1 or more, and preferably indicates an integer of 1 to 10.

[Chem. 24]

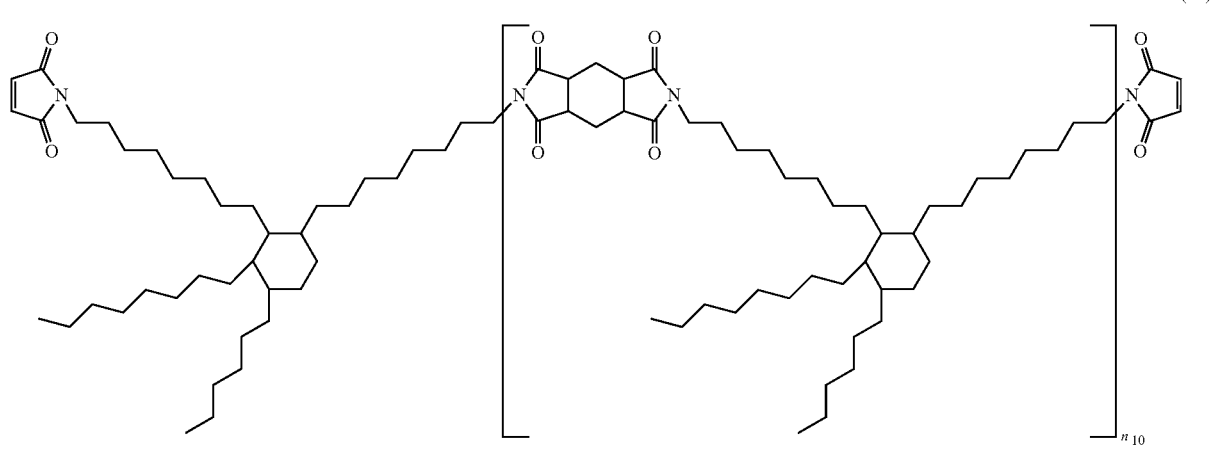

(20)

In Formula (20), $n_{10}$ indicates an integer of 1 or more, and preferably indicates an integer of 1 to 6.

<Thermally Curable Resin or Compound (B)>

(B-1) BMI-689 (compound represented by the following Formula (15), liquid at 25° C., commercially available from DESIGNER MOLECURES Inc.)

(B-2) MIR-5,000 (compound represented by the following Formula (21), solid at 25° C., commercially available from Nippon Kayaku Co., Ltd.)

[Chem. 25]

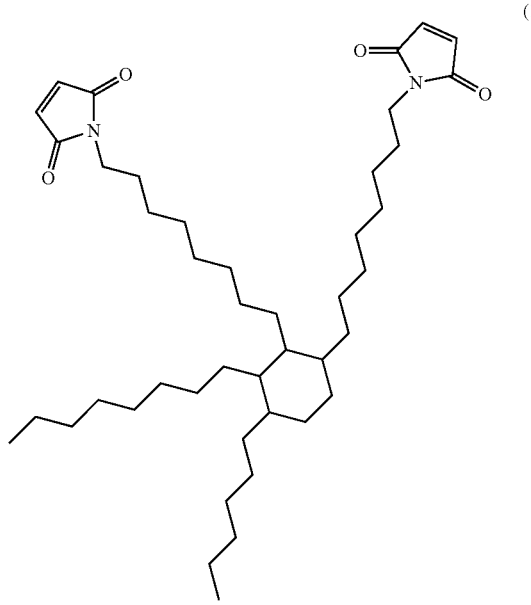

(15)

-continued

[Chem. 26]

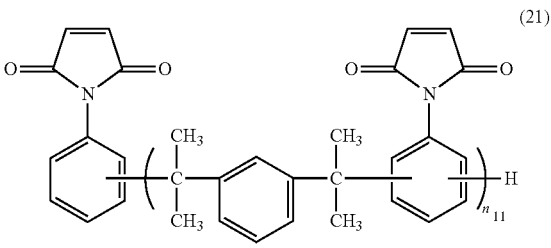

(21)

In Formula (21), $n_{11}$ indicates an integer of 1 or more, and preferably indicates an integer of 1 to 10.

<Polymerization Initiator (C)>

(C-1) Percumyl D (dicumyl peroxide, commercially available from NOF Corporation)

<Curing Accelerator (D)>

(D-1) 2-ethyl-4-methylimidazole (commercially available from Shikoku Chemical Corporation)

<Preparation of Copper Foil Laminate>

The resin film peeled off by etching and two copper foils (CF-T4X-S V (product name), commercially available from Fukuda Metal Foil & Powder Co., Ltd.) were laminated so that the mirror surface of the copper foil faced the resin film, and heat-pressed, and thermo-compressed under conditions of 220° C. and 1.0 MPa for 2 hours to obtain a copper foil laminate in which the copper foil, the cured object of the resin film, and the copper foil were laminated in this order.

<Evaluation of Properties>

The following various properties of the prepared thermally curable resin compositions and copper foil laminates were measured. The results are shown in Table 1.

[Compatibility]

Compatibility is the state obtained by visually observing the mixture after the bismaleimide compound (A), the thermally curable resin or compound (B), the polymerization initiator (C), and the curing accelerator (D) were blended and stirred. Good compatibility indicates that there were no precipitates and application to substrates was possible, and poor compatibility indicates that there were precipitates and the like and application to substrates was difficult.

(Evaluation Criteria)
O: no precipitates
x: precipitates

[Dielectric Characteristics]

The copper foil on both surfaces of the copper foil laminate was removed by etching and dried at 130° C. for 30 minutes, and the cured object of the resin film was then cut out to prepare a test piece of 10 cm×5 cm. The specific dielectric constant and the dielectric tangent at 10 GHz of the obtained test piece were measured using a cavity resonator method dielectric constant measurement device (commercially available from AET, Inc.). After the measurement, the test piece was immersed in water for 24 hours to absorb the water and then taken out of the water and the water was wiped off, it was left in a 30% environment at 25° C. for one day, and the specific dielectric constant and the dielectric tangent at 10 GHz were then measured again.

[Tensile Elastic Modulus]

The copper foil on both surfaces of the copper foil laminate was removed by etching and dried at 130° C. for 30 minutes, and the cured object of the resin film was then cut out to prepare a test piece of 6 cm×5 mm. The tensile elastic modulus and the elongation of the obtained test piece were measured at 25° C. and a rate of 5 mm/min using a tensile test instrument (product name "RTG-1201" commercially available from A&D Co., Ltd.).

[Heat Resistance]

The copper foil on both surfaces of the copper foil laminate was removed by etching and dried at 130° C. for 30 minutes and the cured object of the resin film was then cut into a 4 mm square, and 1.0 to 5.0 mg was weighed out on a measurement pan, and a 5% weight reduction rate (Td5) was measured under conditions of an air flow rate of 100 mL/sec and a temperature increase rate of 10° C./min. TGA/DSC1 (commercially available from METTLER TOLEDOO) was used as a measurement device.

[Glass Transition Temperature]

The copper foil on both surfaces of the copper foil laminate was removed by etching and dried at 130° C. for 30 minutes, and the cured object of the resin film was then cut out to prepare a test piece of 5 cm×5 mm. The obtained test piece was measured using a dynamic viscoelasticity test instrument (DMA: product name "RSA-G2," commercially available from TA Instruments), and the temperature at which tanδ was the maximum value was determined as the glass transition temperature.

[Water Absorption Rate]

The copper foil on both surfaces of the copper foil laminate was removed by etching and dried at 130° C. for 30 minutes, and the cured object of the resin film was then cut out to prepare a test piece of 10 cm×5 cm. The obtained test piece was immersed in water for 24 hours to absorb water and then taken out from water and water was wiped off, and the weight increase rate of the test piece was then used as the water absorption rate.

[HAST Resistance]

Each composition was applied onto Espanex M series in which comb patterns of L/S=100 μm/100 μm were formed by a screen printing method to a thickness of 25 μm (commercially available from Nippon Steel Chemical & Material: a base imide thickness of 25 μm, a Cu thickness of 18 μm), and the coating film was dried in a hot air dryer at 80° C. for 60 minutes. Next, a test substrate for HAST evaluation was obtained by covering the resin surface with AFLEX (Grade: 25N NT) (commercially available from AGC) and heating at 220° C. for 2 hours. The electrode part of the obtained substrate was subjected to wiring connection by soldering and left in an environment at 130° C. and 85% RH, and a voltage of 100 V was applied, and the time until the resistance value became $1\times10^8\Omega$ or less was measured.

O . . . 100 hours or longer
Δ . . . 20 to 100 hours
x . . . 20 hours or shorter

TABLE 1

| Component | Material | Example 1 | Example 2 | Example 3 | Comparative Example 1 | Comparative Example 2 | Comparative Example 3 |
|---|---|---|---|---|---|---|---|
| (A) Bismaleimide compound | A-1 | 80 | 80 | 80 | | | |
| | A'-1 | | | | 80 | | |
| | A'-2 | | | | | 80 | |
| | A'-3 | | | | | | 80 |
| (B) Thermally curable resin | B-1 | 20 | 20 | | 20 | 20 | 20 |
| | B-2 | | | 20 | | | |
| (C) Polymerization initiator | Dicumyl peroxide | 1 | | 1 | 1 | 1 | 1 |
| (D) Curing accelerator | 2-Ethyl-4-methylimidazole | | 1 | | | | |
| Solvent | Toluene | 30 | 30 | 30 | 30 | 30 | 30 |
| Compatibility | | o | o | o | o | o | o |
| Dielectric characteristics | Dielectric constant Dk | 2.2 | 2.2 | 2.3 | 2.9 | 2.4 | 2.3 |
| | Dielectric tangent Df | 0.0013 | 0.0013 | 0.0015 | 0.0038 | 0.0025 | 0.0014 |
| | Dielectric constant Dk after water absorption | 2.2 | 2.2 | 2.3 | 3.1 | 2.4 | 2.3 |
| | Dielectric tangent Df after water absorption | 0.0014 | 0.0013 | 0.0018 | 0.0112 | 0.0030 | 0.0018 |
| Mechanical properties | Tensile elastic modulus (MPa) | 158 | 162 | 666 | 2630 | 400 | 110 |
| | Elongation at break (%) | 123 | 121 | 98 | 3 | 62 | 92 |
| Adhesive strength | 90° peeling (kN/m) | 1.2 | 1.2 | 1.0 | 0.24 | 1.1 | 0.8 |
| Heat resistance | Tg (° C.) | 82 | 84 | 122 | 212 | 35 | 54 |
| | Td5 (° C.) | 414 | 412 | 403 | 363 | 402 | 396 |
| Insulation reliability | Water absorption rate (%) | 0.05 | 0.05 | 0.11 | 1.33 | 0.23 | 0.13 |
| | HAST resistance | o | o | o | x | o | o |

As can be clearly understood from the results shown in Table 1, it was confirmed that the thermally curable resin compositions of Examples 1 to 3 had favorable adhesiveness to substrates, and had low-dielectric characteristics, a low elastic modulus, high heat resistance, and a low water absorption rate as properties of the cured object thereof. Therefore, the thermally curable resin composition of the present invention can be used for applications, for example, photosensitive films, photosensitive films with a support, prepregs, resin sheets, circuit substrates (laminate applications, multilayered printed wiring board applications, etc.), solder resists, underfill materials, die bonding materials, semiconductor encapsulation materials, hole-filling resins, part-embedding resins, and fiber-reinforced composite materials. Accordingly, it is possible to dramatically improve properties of laminates such as print substrates and electronic components such as semiconductor devices.

The invention claimed is:

1. A thermally curable resin composition comprising a bismaleimide compound (A) including a constituent unit represented by the following Formula (1) and maleimide groups at both ends of a molecular chain, a thermally curable resin or compound (B) other than the bismaleimide compound (A), and a polymerization initiator (C) and/or a curing accelerator (D):

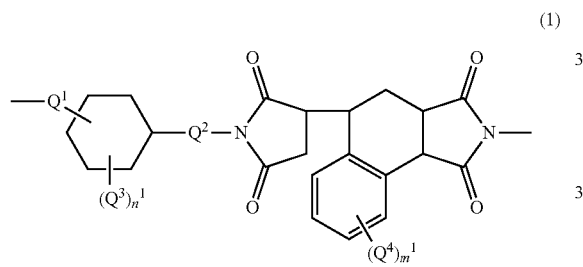

(1)

(in Formula (1), $Q^1$ indicates a linear or branched C1-C16 alkylene group or a linear or branched C2-C16 alkenylene group, $Q^2$ indicates a linear or branched C1-C16 alkylene group or a linear or branched C2-C16 alkenylene group, $Q^3$'s each independently indicate a hydrogen atom, a linear or branched C1-C16 alkyl group, or a linear or branched C2-C16 alkenyl group, $Q^4$'s each independently indicate a hydrogen atom, a linear or branched C1-C6 alkyl group, a halogen atom, a hydroxy group or a linear or branched C1-C6 alkoxy group, $n^1$'s each independently indicate an integer of 1 to 4, and $m^1$'s each independently indicate an integer of 1 to 4).

2. The thermally curable resin composition according to claim 1,
wherein the thermally curable resin or compound (B) further includes one or more selected from the group consisting of maleimide compounds other than the bismaleimide compound (A), a cyanic acid ester compound, a phenolic resin, an epoxy resin, an oxetane resin, a benzoxazine compound, a carbodiimide compound, and a compound having an ethylenically unsaturated group.

3. The thermally curable resin composition according to claim 1,
wherein the polymerization initiator (C) includes a thermal radical polymerization initiator.

4. The thermally curable resin composition according to claim 1,
wherein the curing accelerator (D) includes at least one compound selected from the group consisting of phosphine compounds, compounds containing a phosphonium salt and imidazole compounds.

5. The thermally curable resin composition according to claim 1,
wherein the content of the bismaleimide compound (A) with respect to a total amount of 100 parts by mass of the bismaleimide compound (A) and the thermally curable resin or compound (B) is 1 part by mass to 99 parts by mass.

6. The thermally curable resin composition according to claim 1, further comprising a filling material.

7. A cured object comprising the thermally curable resin composition according to claim 1.

8. A resin sheet comprising:
a support; and
a resin layer that is disposed on one surface or both surfaces of the support,
wherein the resin layer contains the thermally curable resin composition according to claim 1.

9. A prepreg comprising:
a substrate; and
the thermally curable resin composition according to claim 1 that is impregnated into or applied to the substrate.

10. A metal-clad laminate comprising:
a layer containing at least one selected from the group consisting of a resin sheet and a prepreg; and
a metal foil that is provided on one surface or both surfaces of the layer,
wherein the layer contains a cured object of the thermally curable resin composition according to claim 1,
wherein the resin sheet comprises: a support; and a resin layer that is disposed on one surface or both surfaces of the support, wherein the resin layer contains the thermally curable resin composition,
wherein the prepreg comprises: a substrate; and the thermally curable resin composition that is impregnated into or applied to the substrate.

11. A multilayered printed wiring board comprising:
an insulating layer; and
a conductor layer that is formed on one surface or both surfaces of the insulating layer,
wherein the insulating layer contains the thermally curable resin composition according to claim 1.

12. A sealing material comprising the thermally curable resin composition according to claim 1.

13. A fiber-reinforced composite material comprising the thermally curable resin composition according to claim 1 and a reinforcing fiber.

14. An adhesive comprising the thermally curable resin composition according to claim 1.

15. A semiconductor device comprising the thermally curable resin composition according to claim 1.

* * * * *